US010930654B2

(12) United States Patent
Lim et al.

(10) Patent No.: US 10,930,654 B2
(45) Date of Patent: Feb. 23, 2021

(54) SEMICONDUCTOR DEVICES

(71) Applicant: Samsung Electronics Co., Ltd., Suwon-si (KR)

(72) Inventors: Hanjin Lim, Seoul (KR); Kijong Park, Yongin-si (KR); Younsoo Kim, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/441,100

(22) Filed: Jun. 14, 2019

(65) Prior Publication Data
US 2020/0185387 A1 Jun. 11, 2020

(30) Foreign Application Priority Data

Dec. 5, 2018 (KR) .................. 10-2018-0155360

(51) Int. Cl.
*H01L 27/108* (2006.01)
*H01L 29/417* (2006.01)
*H01L 49/02* (2006.01)

(52) U.S. Cl.
CPC ........ *H01L 27/10814* (2013.01); *H01L 28/60* (2013.01); *H01L 29/41725* (2013.01)

(58) Field of Classification Search
CPC .............................................. H01L 27/10814
See application file for complete search history.

(56) References Cited

U.S. PATENT DOCUMENTS

| | | | |
|---|---|---|---|
| 8,058,678 B2 | 11/2011 | Kim et al. | |
| 8,624,354 B2 | 1/2014 | Kim et al. | |
| 8,765,570 B2 | 7/2014 | Malhotra et al. | |
| 2006/0146595 A1* | 7/2006 | Hong | H01L 27/10855 365/154 |
| 2007/0102746 A1* | 5/2007 | Won | H01L 21/76816 257/303 |

(Continued)

FOREIGN PATENT DOCUMENTS

| | | |
|---|---|---|
| KR | 10-2014-0028946 | 3/2014 |
| KR | 10-2019-0085630 | 7/2019 |

OTHER PUBLICATIONS

Kang et al. "Investigation of Ru/TiN Bottom Electrodes Prepared by Chemical Vapor Deposition" Japanese Journal of Applied Physics 43(9B):6635-6639 (2004) (5 pages).

(Continued)

*Primary Examiner* — Moazzam Hossain
*Assistant Examiner* — Mohammad A Rahman
(74) *Attorney, Agent, or Firm* — Myers Bigel, P.A.

(57) ABSTRACT

Semiconductor devices are provided. The semiconductor devices may include an active pattern on a substrate. The active pattern may include a first source/drain region and a second source/drain region. The semiconductor devices may also include a bit line electrically connected to the first source/drain region, a first connection electrode electrically connected to the second source/drain region, and a capacitor on the first connection electrode. The capacitor may include a first electrode, a second electrode, and a dielectric pattern between the first and second electrodes. A lower portion of the dielectric pattern may overlap a top surface of the first connection electrode, and the first electrode may extend on an upper portion of a sidewall of the first connection electrode.

20 Claims, 47 Drawing Sheets

(56) References Cited

U.S. PATENT DOCUMENTS

| | | |
|---|---|---|
| 2009/0114970 A1 | 5/2009 | De-Jonghe et al. |
| 2014/0084419 A1 | 3/2014 | Shih et al. |
| 2018/0190657 A1* | 7/2018 | Chang ............... H01L 27/10852 |
| 2019/0164915 A1* | 5/2019 | Kim .................... H01L 23/3171 |
| 2019/0214455 A1 | 7/2019 | Kang et al. |
| 2020/0144270 A1* | 5/2020 | Hwang ............... G11C 11/4023 |

OTHER PUBLICATIONS

Sung et al. "Formation of alkylsiloxane self-assembled monolayers on Si3N4" J. Vac. Sci. Technol. 17(2):540-544 (Mar./Apr. 1999) (5 pages).

* cited by examiner

SEMICONDUCTOR DEVICES

CROSS-REFERENCE TO RELATED APPLICATION

This U.S. nonprovisional application claims priority under 35 U.S.C. § 119 to Korean Patent Application No. 10-2018-0155360 filed on Dec. 5, 2018 in the Korean Intellectual Property Office, the entire contents of which are hereby incorporated by reference.

BACKGROUND

The present inventive concepts relate to a semiconductor device, and more particularly, to a semiconductor device including a capacitor.

Semiconductor devices have an important role in the electronics industry because of their small size, multi-functionality, and/or low fabrication cost. Data storage devices among the semiconductor devices can store logic data. The data storage devices are increasingly integrated with the development of the electronics industry. As a result, line widths of components constituting the data storage devices continue to decrease.

Additionally, high reliability has been demanded with the high integration of the data storage devices. However, the high integration may reduce the reliability of the data storage devices. Therefore, various studies have been conducted to improve the reliability of the data storage devices.

SUMMARY

Some example embodiments of the present inventive concepts provide a semiconductor device with increased integration.

According to some example embodiments of the present inventive concepts, semiconductor devices may include an active pattern on a substrate. The active pattern may include a first source/drain region and a second source/drain region. The semiconductor devices may also include a bit line electrically connected to the first source/drain region, a first connection electrode electrically connected to the second source/drain region, and a capacitor on the first connection electrode. The capacitor may include a first electrode, a second electrode, and a dielectric pattern between the first and second electrodes. A lower portion of the dielectric pattern may overlap a top surface of the first connection electrode, and the first electrode may extend on an upper portion of a sidewall of the first connection electrode.

According to some example embodiments of the present inventive concepts, semiconductor devices may include an active pattern on a substrate. The active pattern may include a first source/drain region and a second source/drain region. The semiconductor devices may also include a bit line electrically connected to the first source/drain region, a connection electrode electrically connected to the second source/drain region, and a capacitor on the connection electrode. The capacitor may include a first electrode, a second electrode, and a dielectric pattern between the first and second electrodes. The first electrode may extend upwardly along an outer sidewall of the dielectric pattern from an upper portion of a sidewall of the connection electrode, and the second electrode may extend upwardly along an inner sidewall of the dielectric pattern from a top surface of a lower portion of the dielectric pattern.

According to some example embodiments of the present inventive concepts, semiconductor devices may include a plurality of transistors on a substrate, a plurality of capacitors electrically connected to the plurality of transistors, respectively, and a support layer that contacts upper portions of the plurality of capacitors. Each of the plurality of capacitors may include a first electrode, a second electrode, and a dielectric pattern between the first and second electrodes, and the dielectric pattern may have a cylindrical shape whose top is opened. The support layer may contact an upper portion of an outer sidewall of the dielectric pattern of one of the plurality of capacitors.

DETAILED DESCRIPTION

Figure 1:
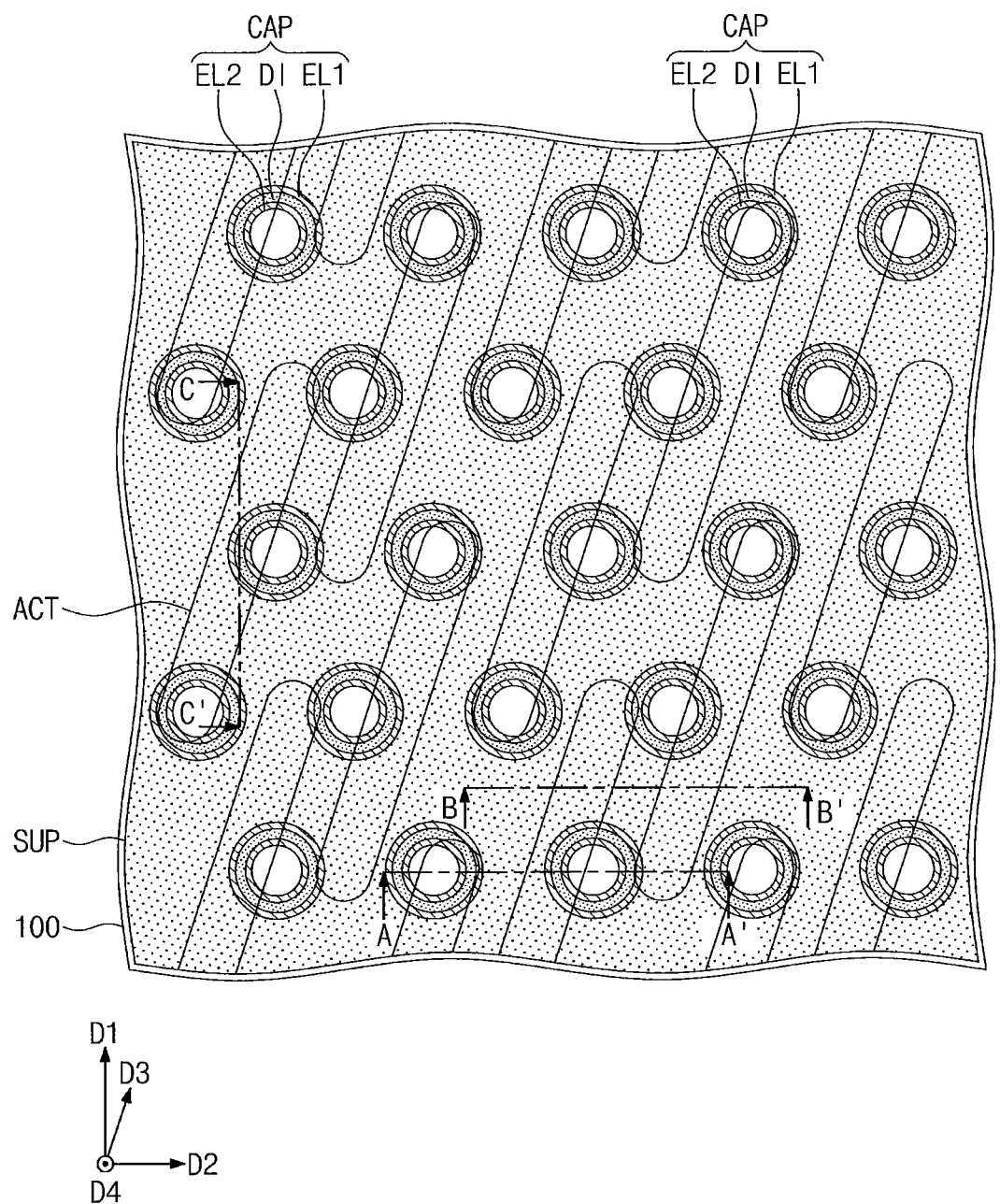
FIG. 1 illustrates a plan view showing a semiconductor device according to some example embodiments of the present inventive concepts.
Figure 2A:
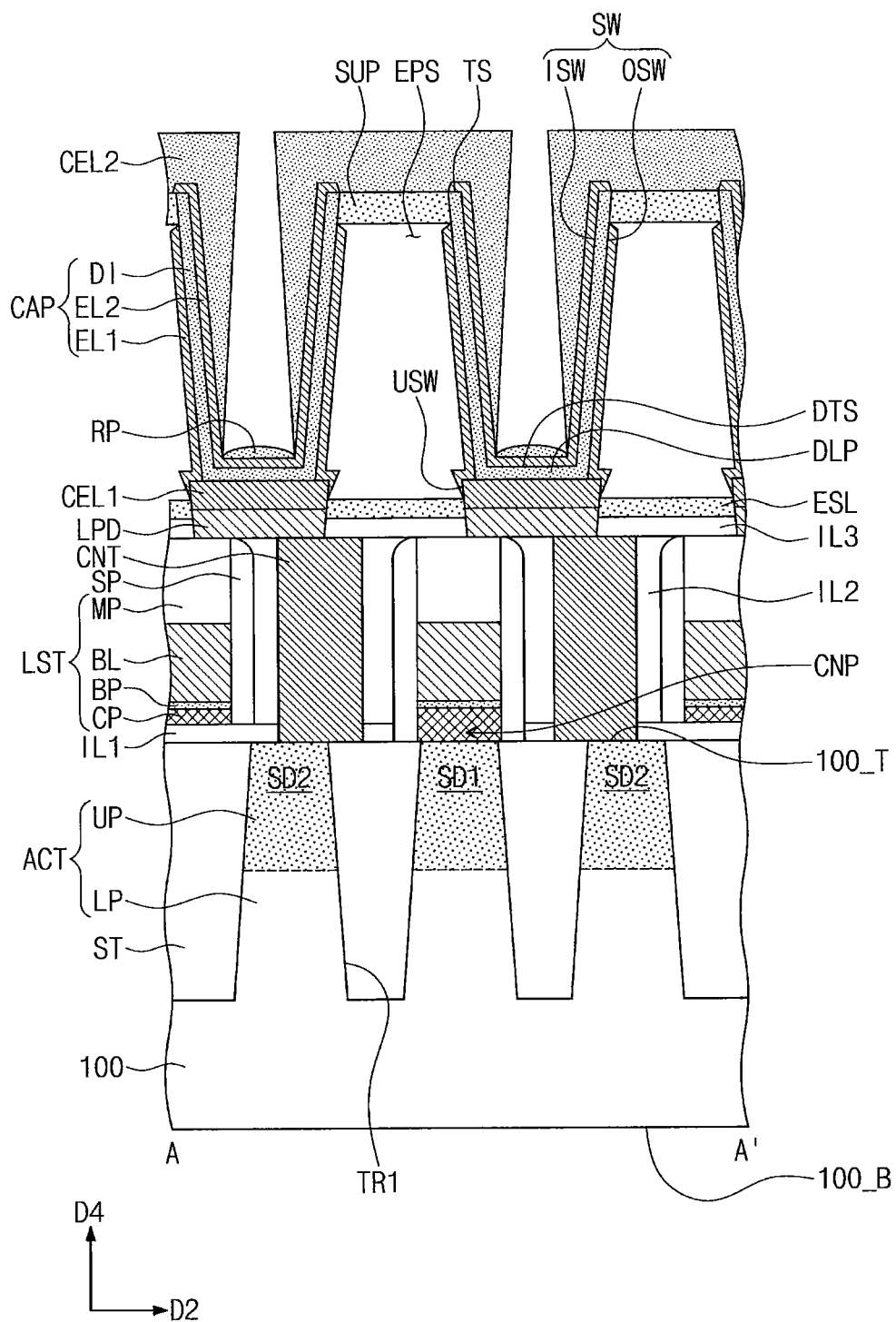
FIGS. 2A, 2B, and 2C illustrate cross-sectional views respectively taken along lines A-A', B-B', and C-C' of FIG. 1.
Figure 2B:
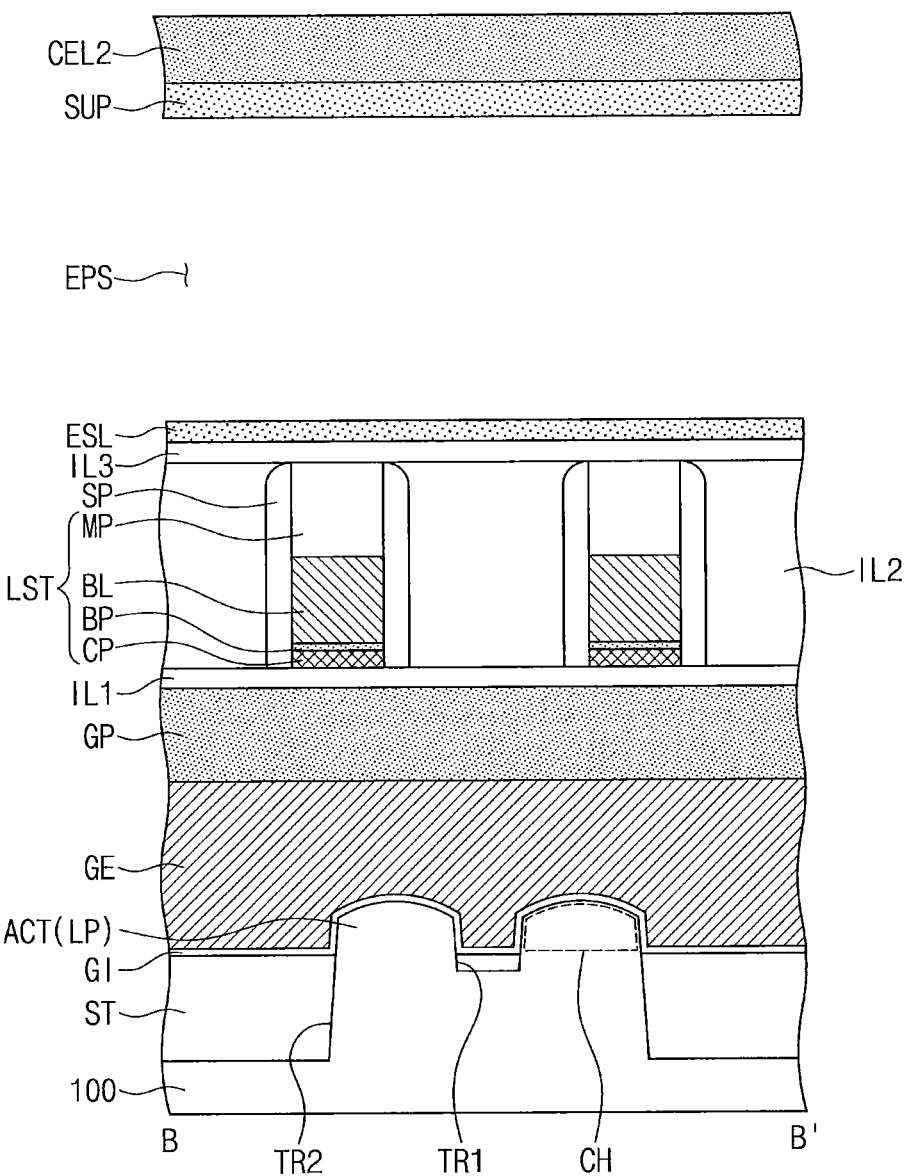
Figure 2C:
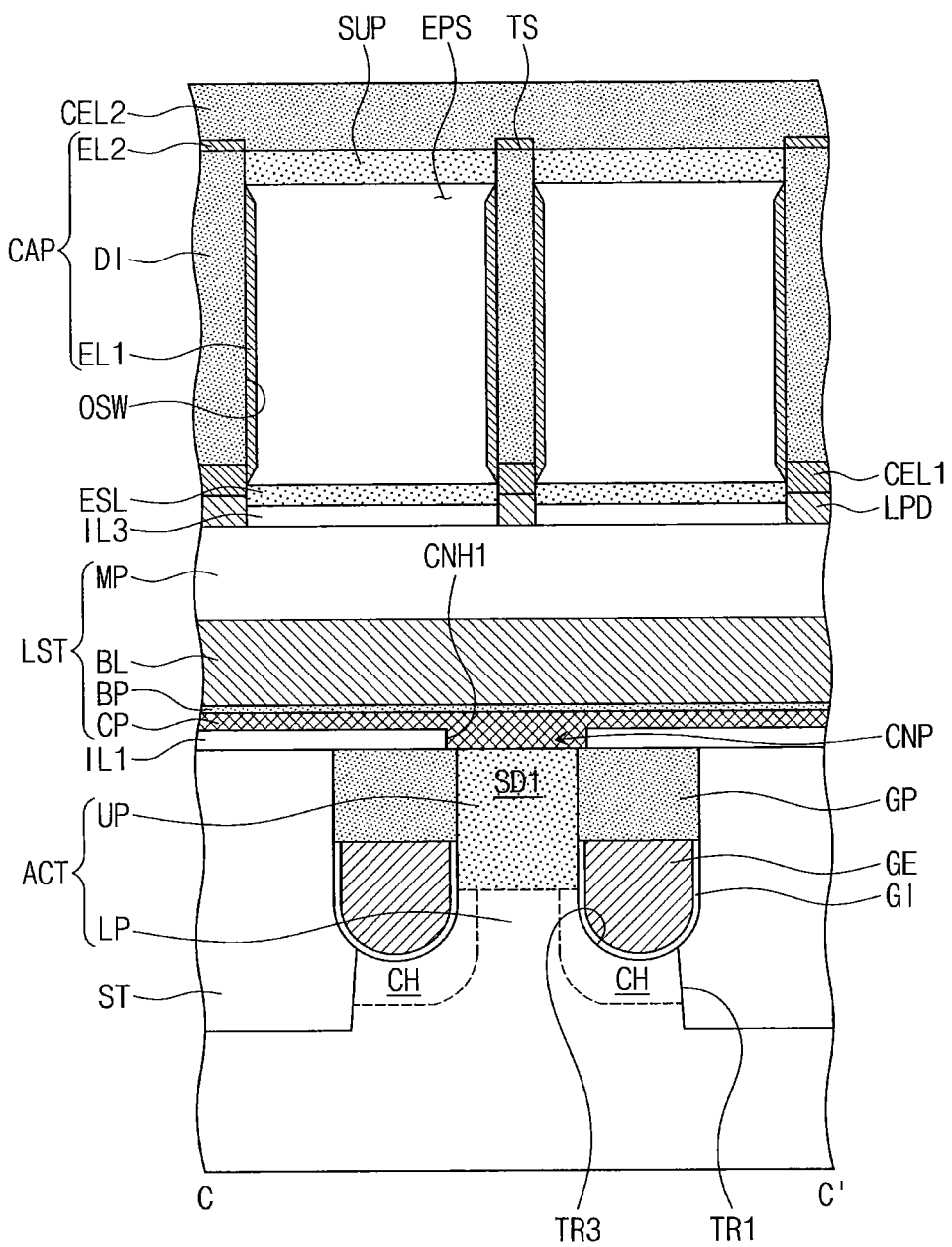
Figure 3:
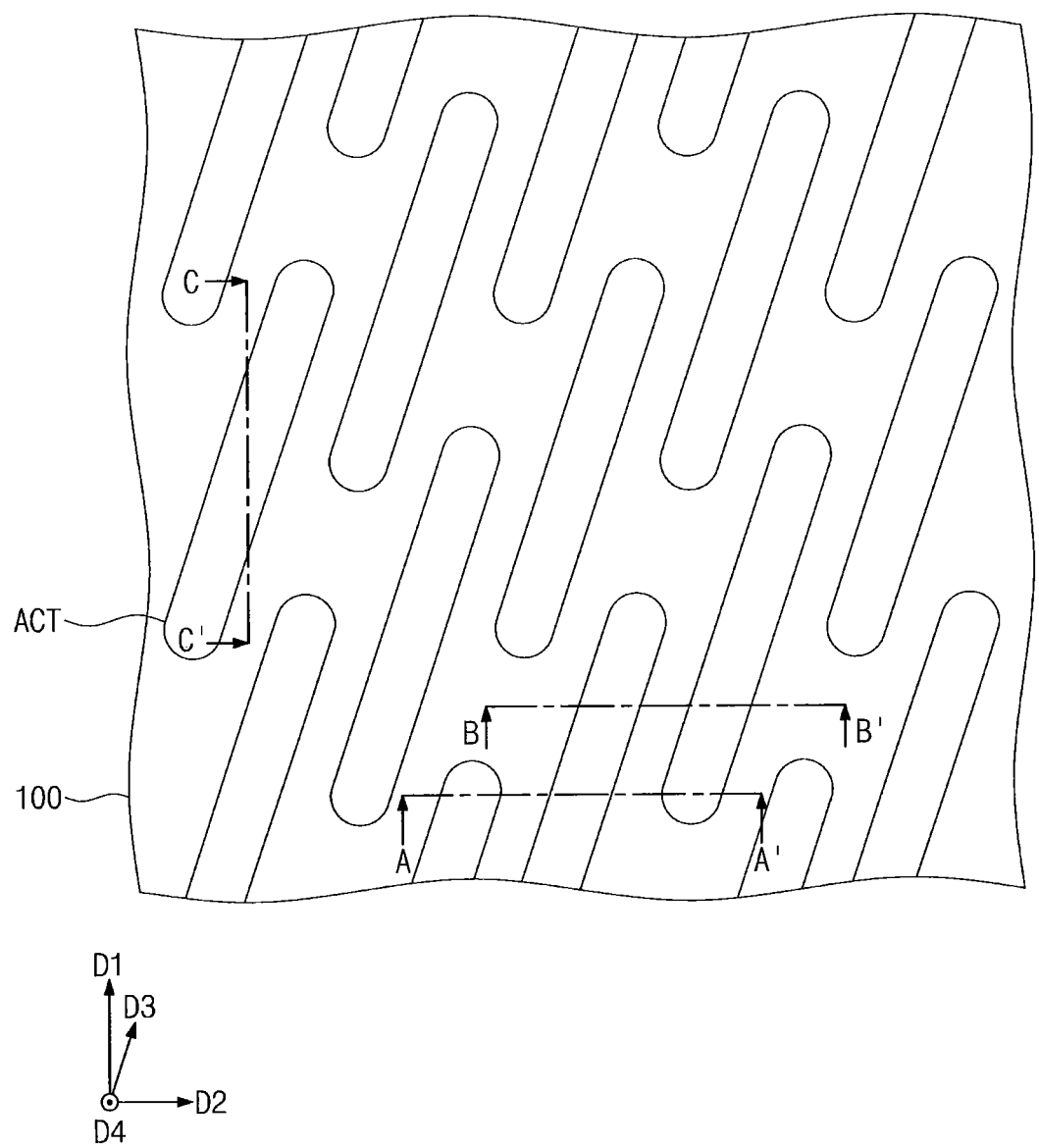
FIGS. 3, 5, 7, 9, 11, 13, 15, 17, 19, 21, and 23 illustrate plan views showing a method of fabricating a semiconductor device according to some example embodiments of the present inventive concepts.
Figure 4A:
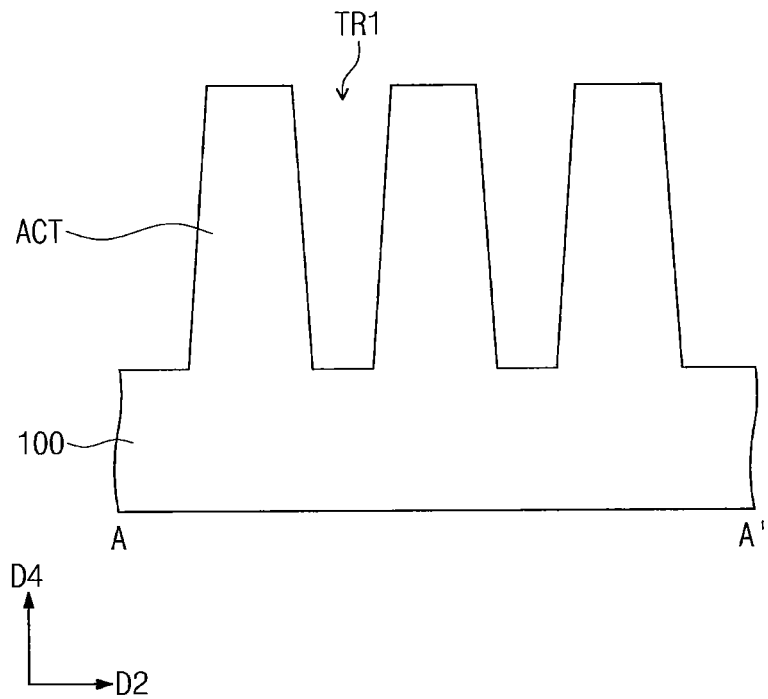
FIGS. 4A, 6A, 8A, 10A, 12A, 14A, 16A, 18A, 20A, 22A, and 24A illustrate cross-sectional views taken along line A-A' of FIGS. 3, 5, 7, 9, 11, 13, 15, 17, 19, 21, and 23, respectively.
Figure 4B:
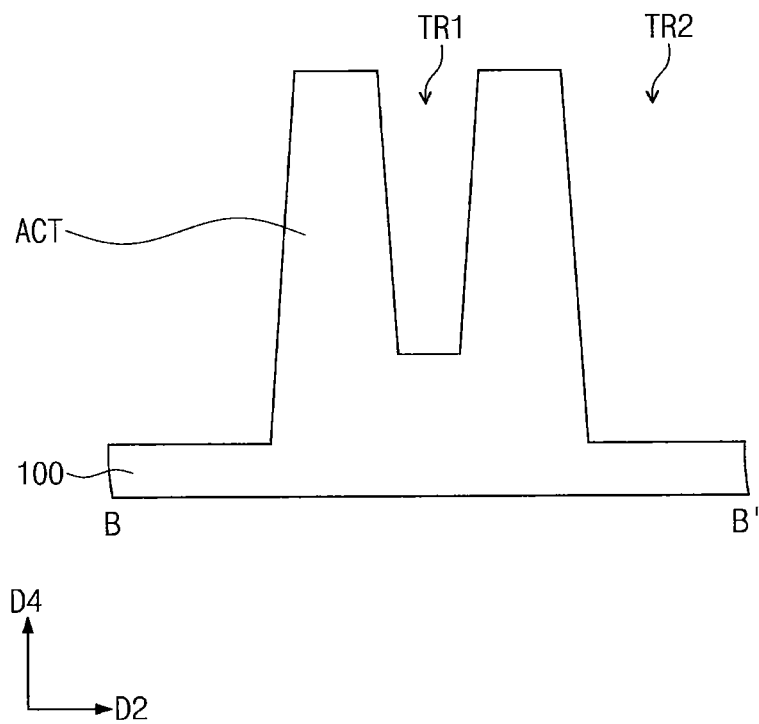
FIGS. 4B, 6B, 8B, 10B, 12B, 14B, 16B, 18B, 20B, 22B, and 24B illustrate cross-sectional views taken along line B-B' of FIGS. 3, 5, 7, 9, 11, 13, 15, 17, 19, 21, and 23, respectively.
Figure 4C:
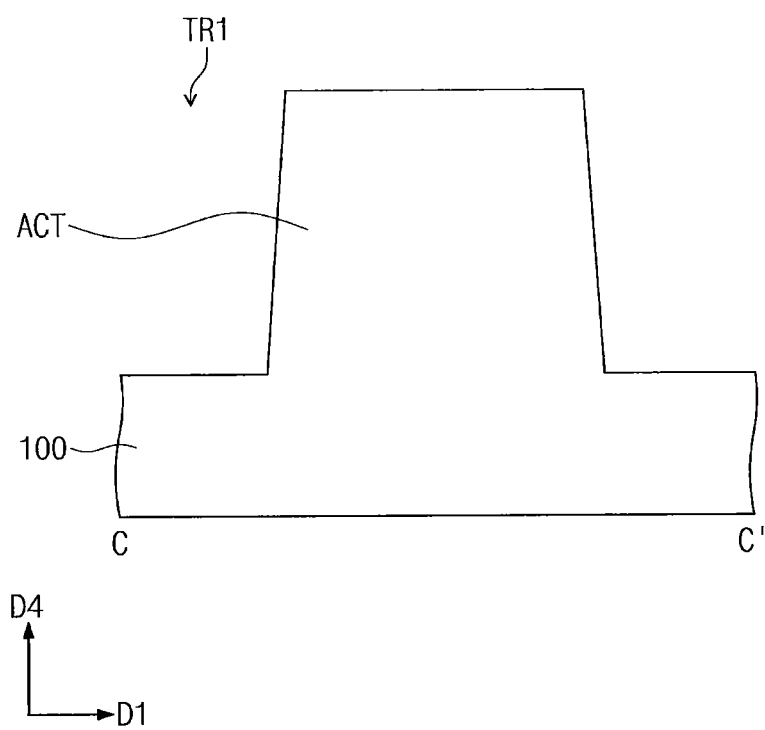
FIGS. 4C, 6C, 8C, 10C, 12C, 14C, 16C, 18C, 20C, 22C, and 24C illustrate cross-sectional views taken along line C-C' of FIGS. 3, 5, 7, 9, 11, 13, 15, 17, 19, 21, and 23, respectively.
Figure 5:
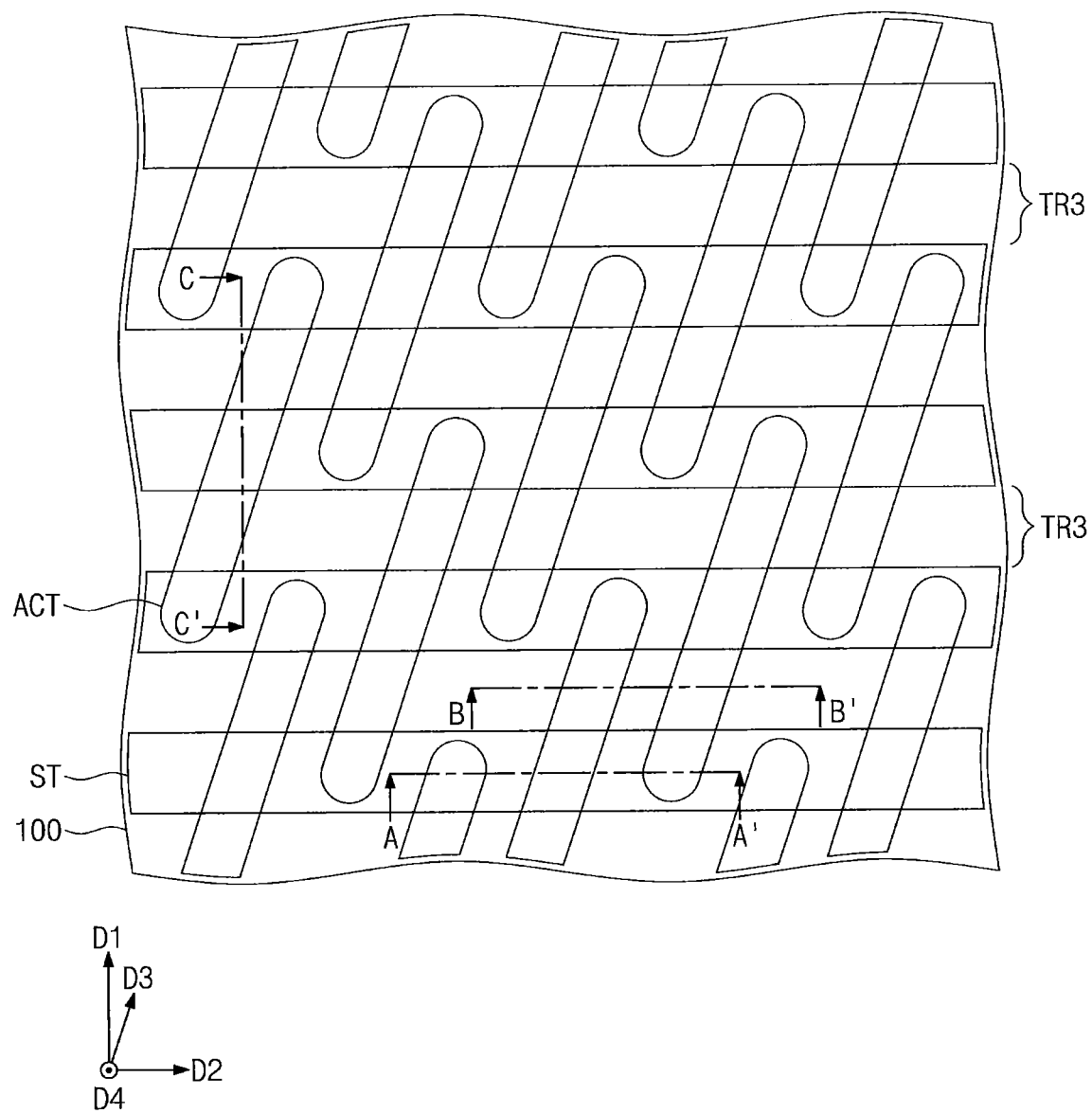

FIG. 1 illustrates a plan view showing a semiconductor device according to some example embodiments of the present inventive concepts. FIGS. 2A, 2B, and 2C illustrate cross-sectional views respectively taken along lines A-A', B-B', and C-C' of FIG. 1.

Referring to FIGS. 1 and 2A to 2C, a substrate 100 may be provided thereon with a device isolation layer ST defining active patterns ACT. The substrate 100 may be, for example, a semiconductor substrate including silicon, germanium, or silicon-germanium. The device isolation layer ST may include, for example, a silicon oxide layer.

The active patterns ACT may be formed when an upper portion of the substrate 100 is patterned. Each of the active patterns ACT may extend in a third direction D3 parallel to a top surface (e.g., 100_T in FIG. 2A that is parallel to a bottom surface 100_B of the substrate 100) of the substrate 100. The active patterns ACT may be two-dimensionally arranged along a first direction D1 and a second direction D2. The active patterns ACT may be spaced apart from each other in the third direction D3. In some embodiments, both the first direction D1 and the second direction D2 may be parallel to the top surface 100_T and the bottom surface 100_B of the substrate 100, and the first direction D1 may be perpendicular to the second direction D2. It will be understood that each of the first direction D1, the second direction D2, and the third direction D3 may be referred to as a horizontal direction.

Each of the active patterns ACT may have a width that decreases toward a vertical direction (e.g., a fourth direction D4) to the top surface of the substrate 100. The width of each of the active patterns ACT may decrease with increasing distance from the bottom surface 100_B of the substrate 100. In some embodiments, each of the active patterns ACT may have a width in the second direction D2 that decreases along the fourth direction D4, as illustrated in FIG. 2A. In some embodiments, the fourth direction D4 may be perpendicular to the top surface 100_T and the bottom surface 100_B of the substrate 100 as well as all of the first, second, and third directions D1, D2, and D3. It will be understood that the fourth direction D4 may be referred to as a vertical direction.

First and second trenches TR1 and TR2 may be defined between the active patterns ACT. The device isolation layer ST may fill the first and second trenches TR1 and TR2 between the active patterns ACT. The first trench TR1 may be defined between a pair of active patterns ACT adjacent to each other in the second direction D2. The second trench TR2 may be defined between a pair of active patterns ACT adjacent to each other in the third direction D3. It will be understood that "an element A fills an element B" (or similar language) as used herein means that the element A is in the element B but does not necessarily mean that the element A fills the element B entirely. It will be also understood that "a pair of elements A adjacent to each other in a direction B" (or similar language) as used herein may refer to two elements A between which no other like element is located along the direction B. For example, as shown in FIG. 2A, two active patterns ACT, which define opposing sides of the first trench TR1, can be referred to as a pair of active patterns ACT adjacent to each other in the second direction D2 as there is no active pattern ACT between the two active patterns ACT along the second direction D2.

A distance between a pair of active patterns ACT adjacent to each other in the second direction D2 may be less than that between a pair of active patterns ACT adjacent to each other in the third direction D3. As such, the second trench TR2 may be deeper than the first trench TR1. For example, the second trench TR2 may have a floor (e.g., a bottom surface) lower than that of the first trench TR1. In some embodiments, as shown in FIG. 2B, the second trench TR2 may have a depth that is greater than a depth of the first trench TR1, as illustrated in FIG. 2B.

Each of the active patterns ACT may include a first segment LP and a second segment UP on the first segment LP. For example, the first segment LP may be a lower portion of the active pattern ACT, and the second segment UP may be an upper portion of the active pattern ACT. It will be understand that "segment" as used herein refers to "portion."

Each of the active patterns ACT may include a first source/drain region SD1 and a pair of second source/drain regions SD2. For example, the second segment UP of the active pattern ACT may include the first source/drain region SD1 and the pair of second source/drain regions SD2. The first source/drain region SD1 may be placed between the pair of second source/drain regions SD2.

A pair of third trenches TR3 may be defined on each of the active patterns ACT. Each of the third trenches TR3 may be defined between the first source/drain region SD1 and the second source/drain region SD2. The third trench TR3 may downwardly extend from a top surface of the active pattern ACT toward the bottom surface 100_B of the substrate 100, while penetrating the second segment UP of the active pattern ACT. The third trench TR3 may have a floor (e.g., a bottom surface) higher than those of the first and second trenches TR1 and TR2.

Each of the active patterns ACT may further include a pair of channel regions CH. For example, the first segment LP of the active pattern ACT may include the pair of channel regions CH. When viewed in plan, the channel region CH may be interposed between the first source/drain region SD1 and the second source/drain region SD2. The channel region CH may be disposed below the third trench TR3. The channel region CH may thus be positioned lower than the first and second source/drain regions SD1 and SD2.

Gate electrodes GE may be provided to run across the active patterns ACT and the device isolation layer ST. The gate electrodes GE may be provided in the third trenches TR3. The gate electrodes GE may extend (e.g., extend longitudinally) in parallel to each other in the second direction D2. A pair of gate electrodes GE may be provided on a pair of channel regions CH of each of the active patterns ACT. The gate electrode GE may have a top surface lower than the top surface 100_T of the active pattern ACT (e.g., a top surface of the first source/drain region SD1 or a top surface of the second source/drain region SD2).

Referring back to FIG. 2C, the gate electrode GE may have an upper portion adjacent to the second segment UP of the active pattern ACT. The gate electrode GE may have a lower portion adjacent to the first segment LP of the active pattern ACT. For example, the lower portion of the gate electrode GE may be adjacent to the channel region CH.

Referring back to FIGS. 1 and 2A to 2C, a gate dielectric layer GI may be interposed between the gate electrode GE and the active pattern ACT. A gate capping layer GP may be provided on the gate electrode GE. The gate capping layer GP may cover the top surface of the gate electrode GE. The gate capping layer GP may have a top surface coplanar with that of the active pattern ACT. It will be understood that "an element A covers a surface of an element B" (or similar language) as used herein means that the element A extends on the surface of the element B but does not necessarily mean that the element A covers the surface of the element B entirely.

The gate electrode GE may include, for example, one or more of conductive metal nitride (e.g., titanium nitride or tantalum nitride) and metal (e.g., titanium, tantalum, tungsten, copper, or aluminum). The gate dielectric layer GI may include, for example, one or more of a silicon oxide layer, a silicon nitride layer, a silicon oxynitride layer, and a high-k dielectric material. For example, the high-k dielectric material may include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof. The gate capping layer GP may include, for example, one or more of a silicon oxide layer, a silicon nitride layer, and a silicon oxynitride layer.

A first interlayer insulating layer IL1 may be provided on the substrate 100. The first interlayer insulating layer IL1 may include first contact holes CNH1 exposing the first source/drain regions SD1 of the active patterns ACT.

Figure 11:
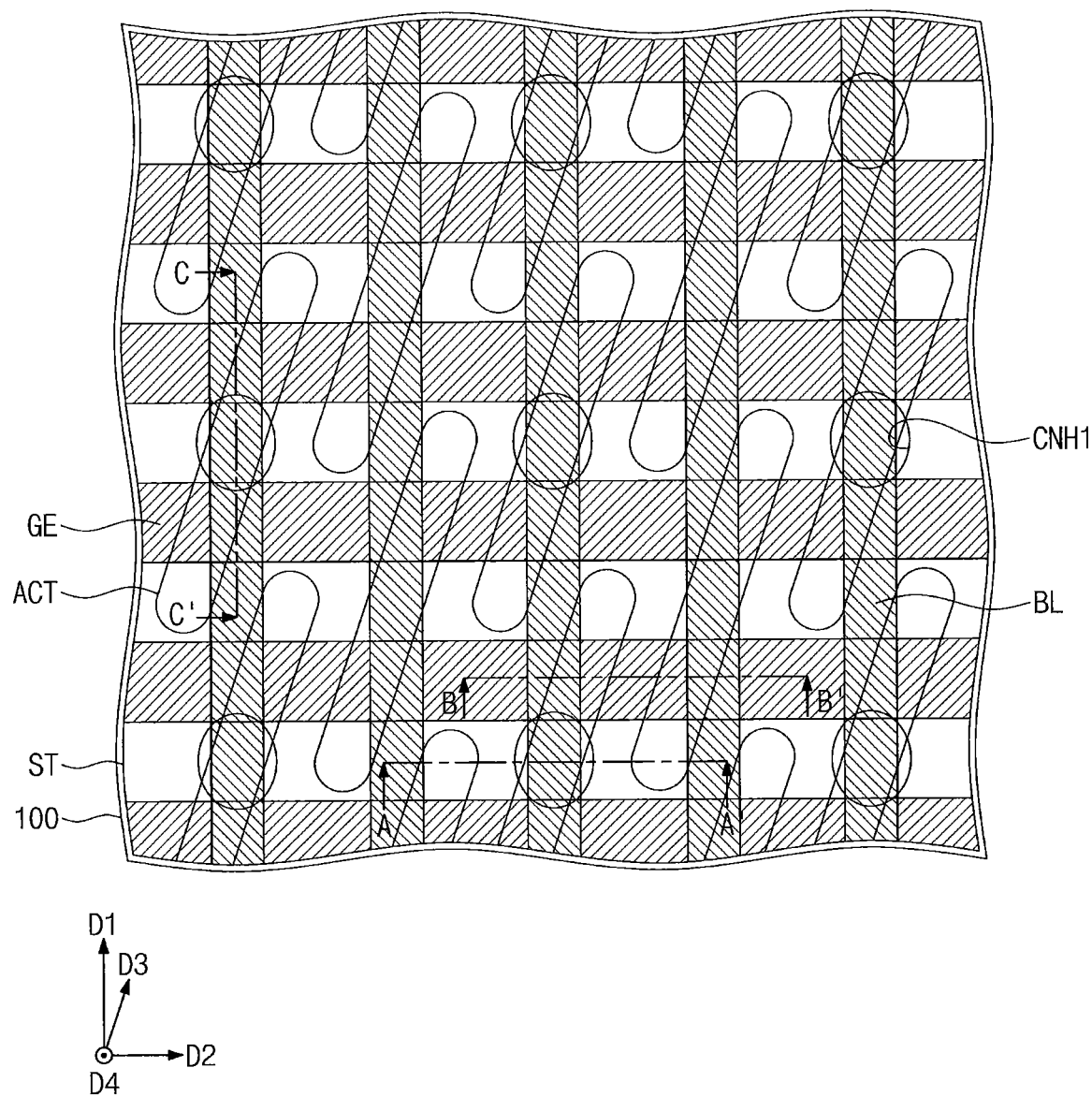
Figure 12A:
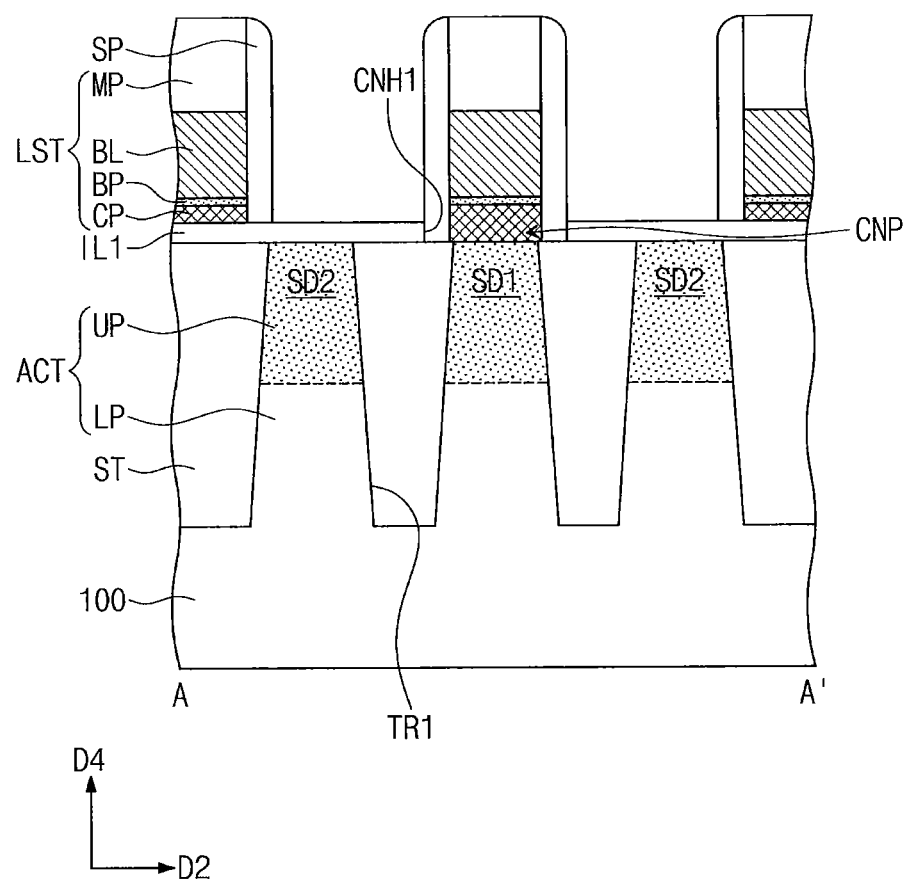
Figure 12B:
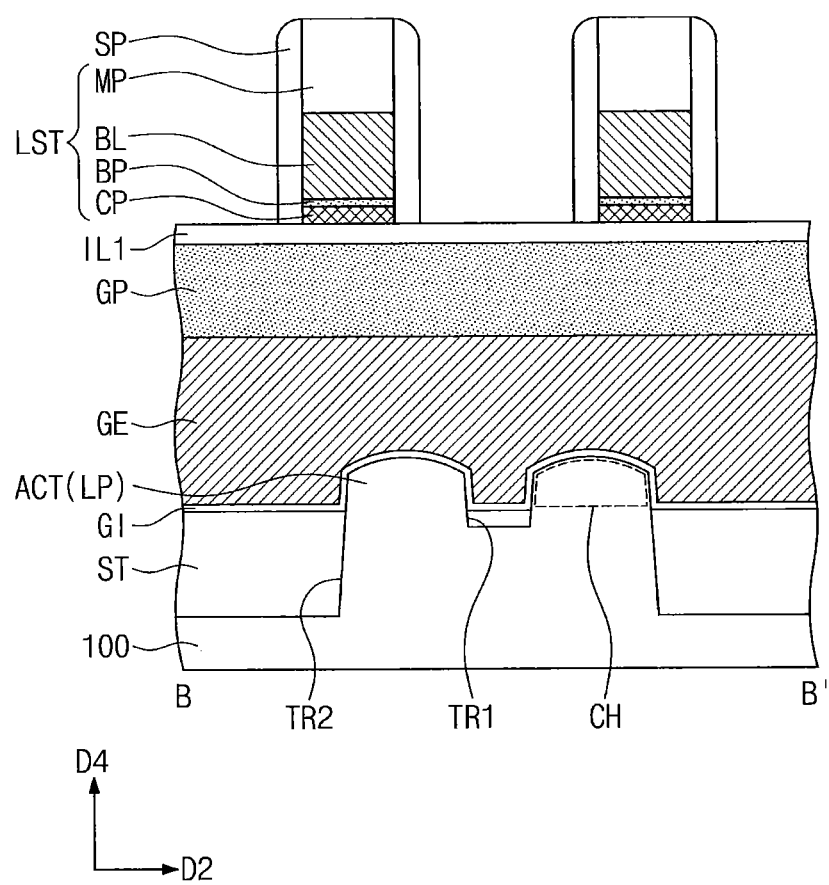
Figure 12C:
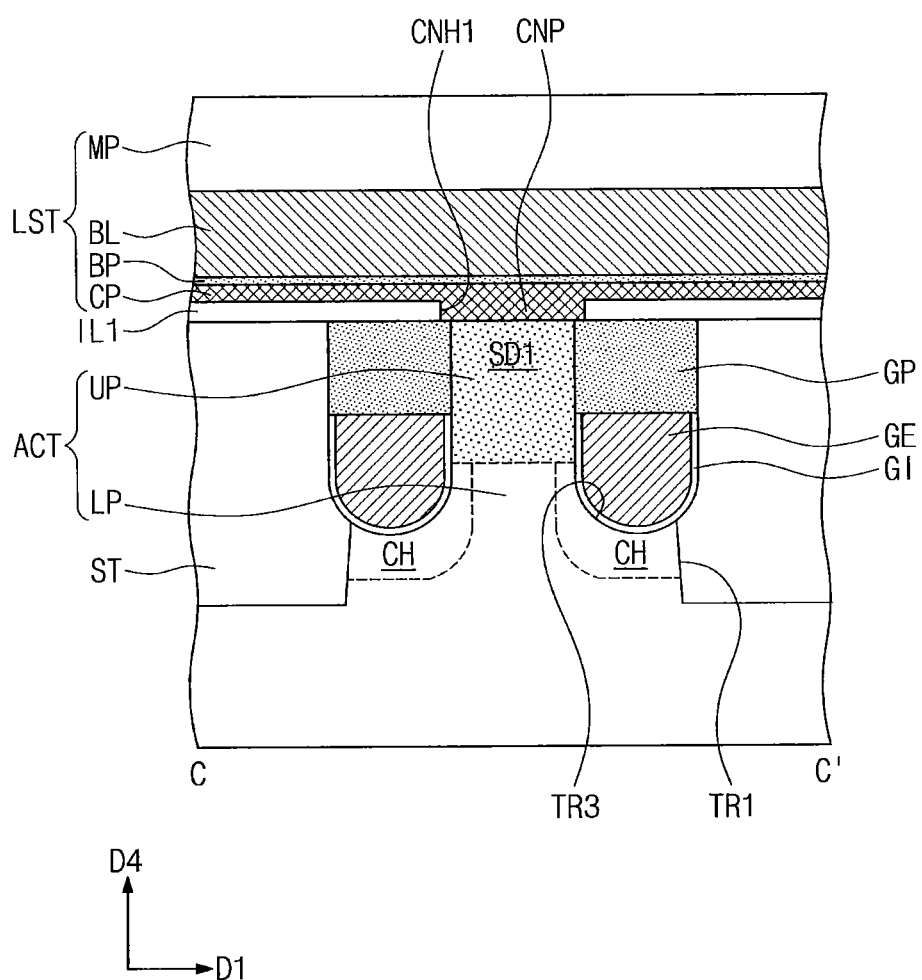
Figure 13:
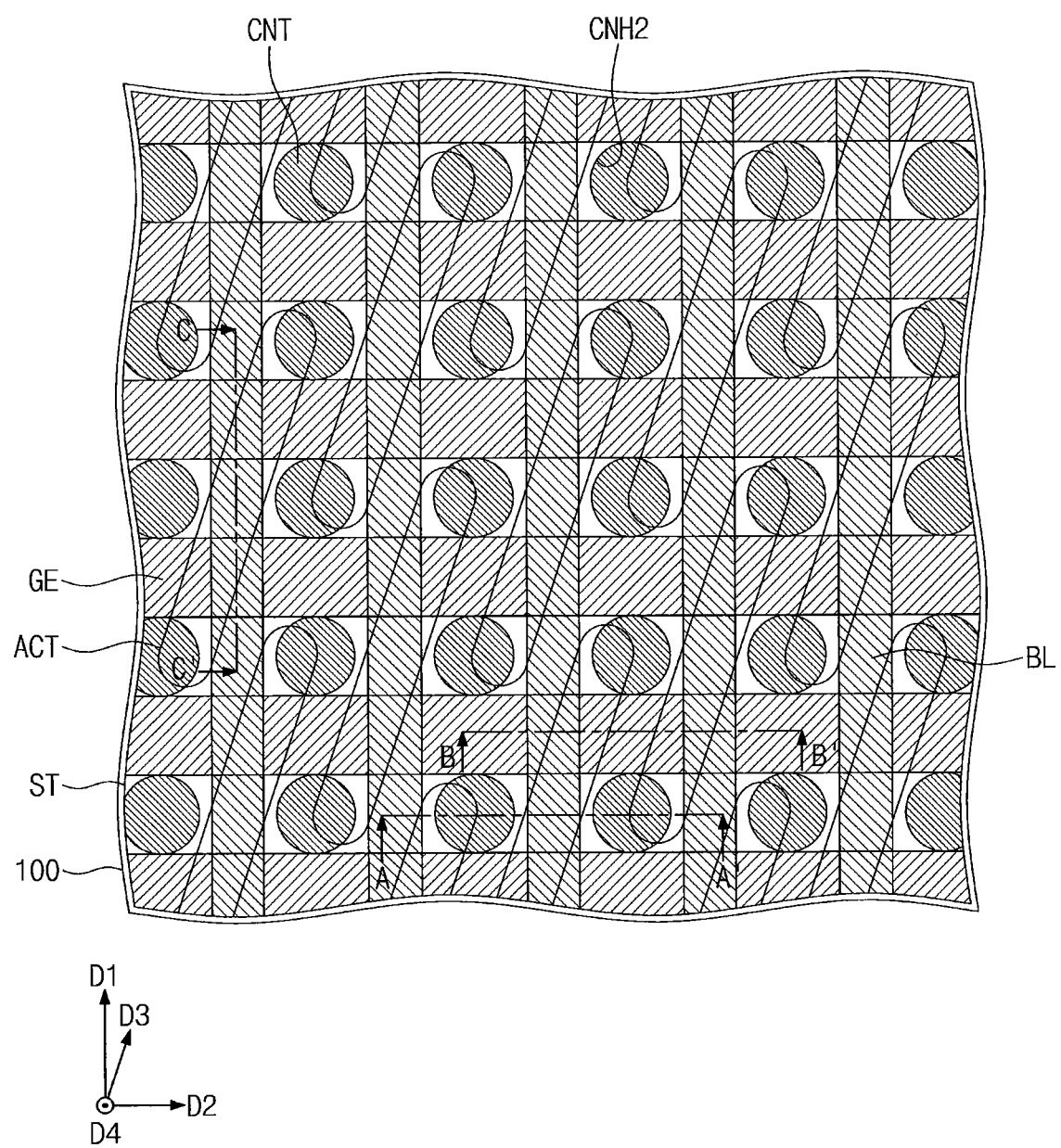
Figure 14A:
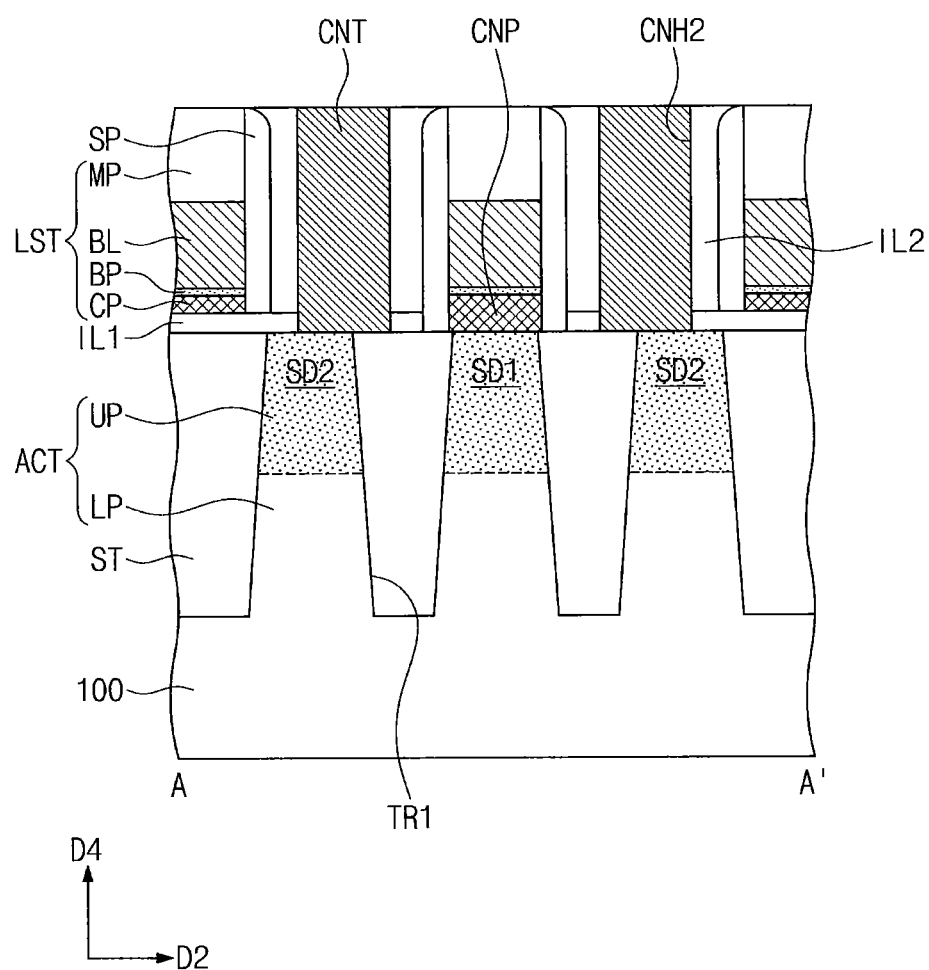
Figure 14B:
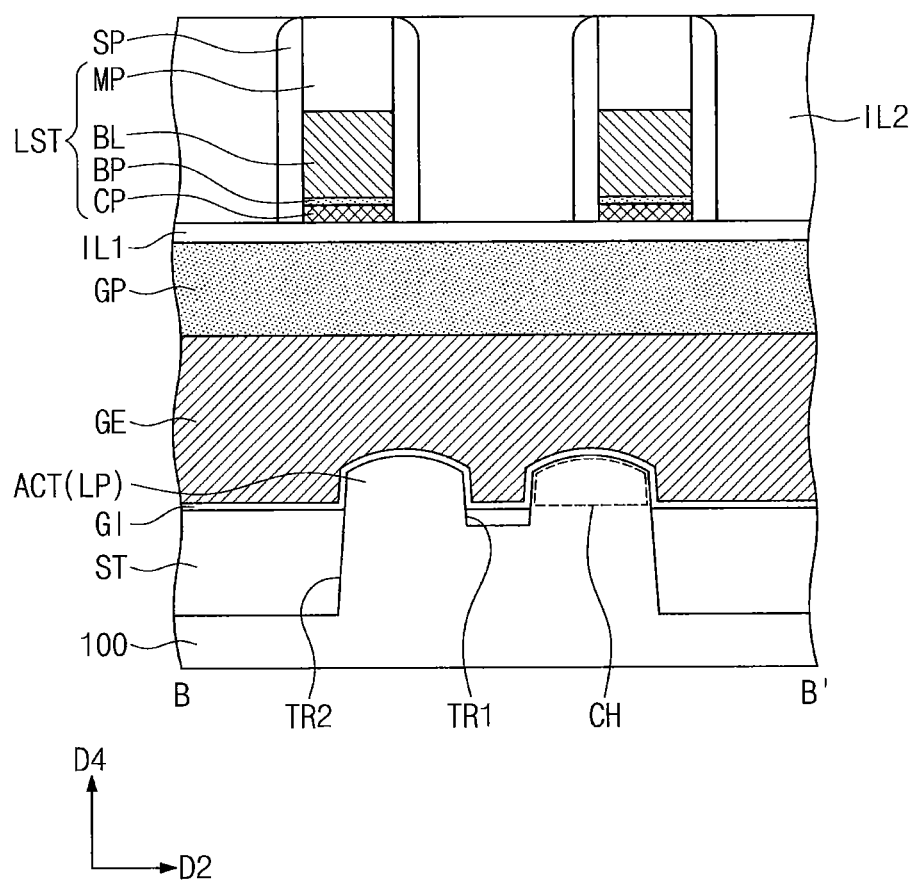
Figure 14C:
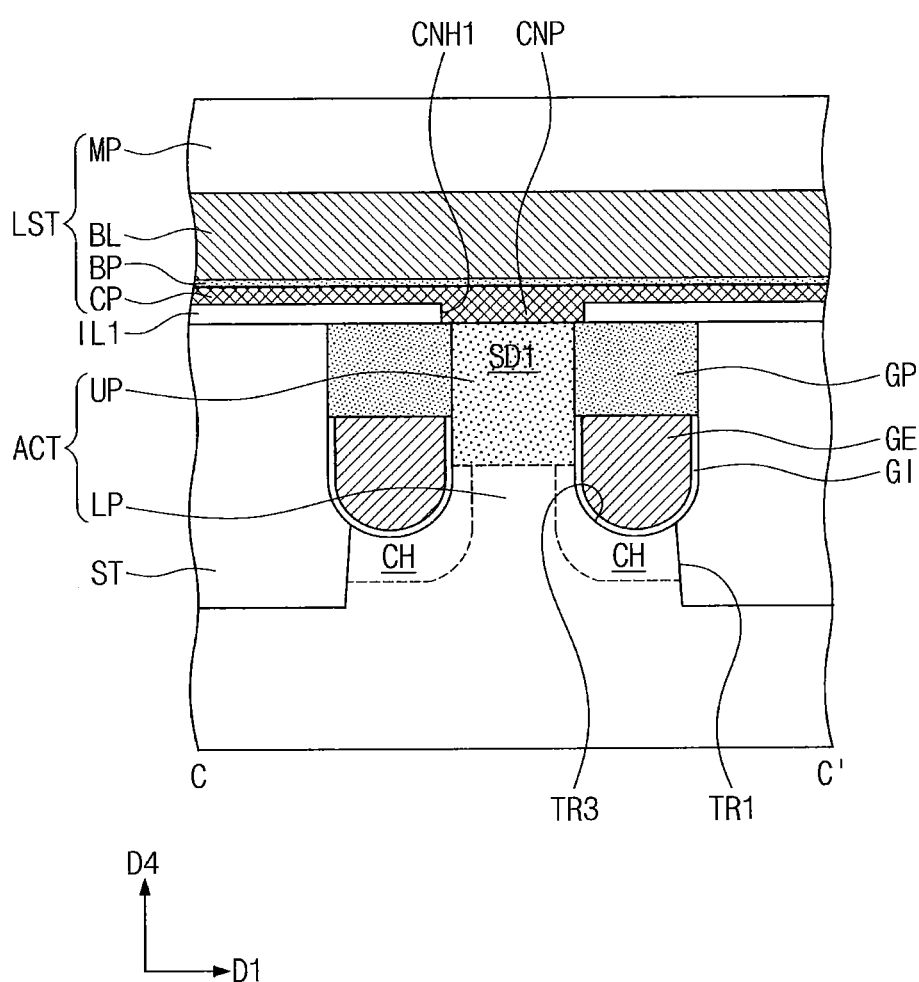
Figure 15:
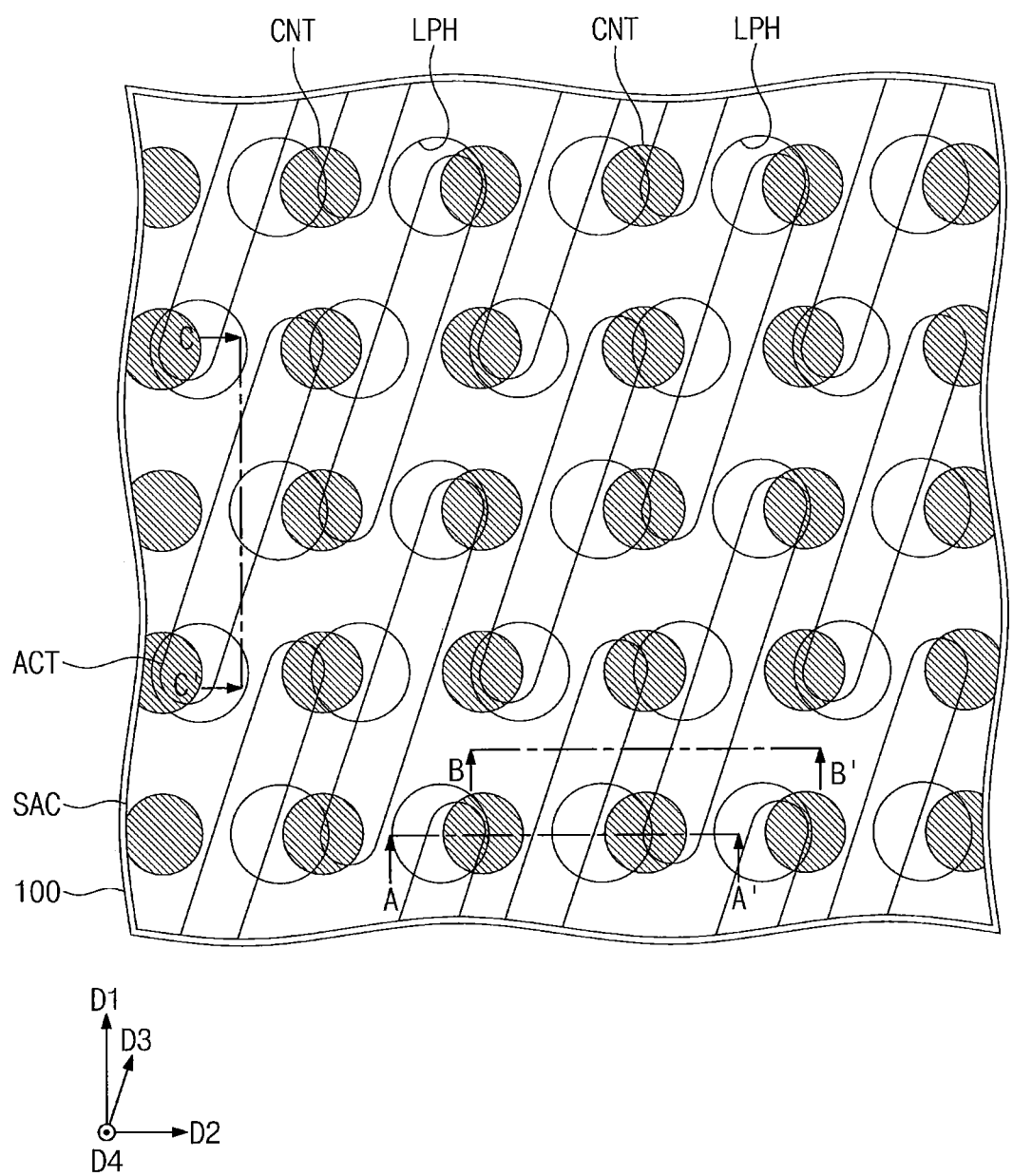

The first interlayer insulating layer IL1 may be provided thereon with line structures LST extending in the first direction D1. The line structures LST may be spaced apart from each other in the second direction D2. When viewed in plan, the line structures LST may intersect or traverse the gate electrodes GE (see FIG. 11). A pair of spacers SP may be provided on opposite sidewalls of each of the line structures LST. The spacers SP may include, for example, one or more of a silicon oxide layer, a silicon nitride layer, and a silicon oxynitride layer.

Each of the line structures LST may include a conductive pattern CP, a barrier pattern BP, a bit line BL, and a mask pattern MP that are sequentially stacked on the substrate 100. The conductive pattern CP may include a contact part CNP that fills the first contact hole CNH1 and contacts the first source/drain region SD1. The barrier pattern BP may reduce or possibly prevent a metallic material in the bit line BL from diffusing toward the conductive pattern CP. The bit line BL may be electrically connected to the first source/drain region SD1 through the barrier pattern BP and the conductive pattern CP.

The conductive pattern CP may include, for example, one of a doped semiconductor material (e.g., doped silicon or doped germanium), a metallic material (e.g., titanium, tantalum, tungsten, copper, or aluminum), and a metal-semiconductor compound (e.g., tungsten silicide, cobalt silicide, or titanium silicide). The barrier pattern BP may include, for example, conductive metal nitride (e.g., titanium nitride or tantalum nitride). The bit line BL may include, for example, a metallic material (e.g., titanium, tantalum, tungsten, copper, or aluminum).

A second interlayer insulating layer IL2 may be provided on the first interlayer insulating layer IL1. The second interlayer insulating layer IL2 may cover the spacers SP. Contacts CNT may be provided to penetrate the second and first interlayer insulating layer IL2 and IL1 and to have connection with corresponding second source/drain regions SD2. The spacers SP may separate the contacts CNT from the bit lines BL. The contacts CNT may include, for example, one or more of conductive metal nitride (e.g., titanium nitride or tantalum nitride) and metal (e.g., titanium, tantalum, tungsten, copper, or aluminum). In some embodiments, the contact CNT may contact the second source/drain region SD2 as illustrated in FIG. 2A.

A dielectric layer IL3 and ESL may be provided on the second interlayer insulating layer IL2. The dielectric layer IL3 and ESL may include a third interlayer insulating layer IL3 and an etch stop layer ESL that are sequentially stacked on the substrate 100. For example, the first, second, and third interlayer insulating layers ILL IL2, and IL3 may include a silicon oxide layer, and the etch stop layer ESL may include a silicon nitride layer.

Landing pads LPD may be provided to penetrate the third interlayer insulating layer IL3 and to have connection with corresponding contacts CNT. The landing pads LPD may be electrically connected through the contacts CNT to corresponding second source/drain regions SD2. The landing pad LPD may be misaligned with the contact CNT. The landing pad LPD may be horizontally offset from a center of the contact CNT. The landing pad LPD may have a bottom surface whose portion is in contact with a top surface of the contact CNT. In some embodiments, a center of the landing pad LPD in the second direction D2 may be offset from a center of the contact CNT in the second direction D2, as illustrated in FIG. 2A.

First connection electrodes CEL1 may be provided on corresponding landing pads LPD. Each of the first connection electrodes CEL1 may have a top surface higher than that of the etch stop layer ESL. For example, the first connection electrode CEL1 may have an upper sidewall USW (e.g., an upper portion of a sidewall) not covered with the etch stop layer ESL. The landing pads LPD may include, for example, metal. The first connection electrodes CEL1 may include, for example, metal and/or conductive metal nitride. As used herein the term "and/or" includes any and all combinations of one or more of the associated listed items.

Capacitors CAP may be provided on corresponding first connection electrodes CEL1. Each of the capacitors CAP may include a first electrode EL1, a dielectric pattern DI, and a second electrode EL2. The dielectric pattern DI may be interposed between the first electrode EL1 and the second electrode EL2. A support layer SUP may be provided to connect upper portions of the capacitors CAP to each other. The support layer SUP may physically or mechanically support the capacitors CAP. An empty space EPS may be defined and surrounded by the support layer SUP, the capacitors CAP, and the etch stop layer ESL. In some embodiments, the support layer SUP may surround outer sidewalls of upper portions of the capacitors CAP and may not be formed within the capacitors CAP, as illustrated in FIGS. 1 and 2A. Accordingly, in some embodiments, the support layer SUP may include multiple openings OP, as illustrated in FIG. 1. It will be understood that "an element A surrounds an element B" (or similar language) as used herein means that the element A is at least partially around the element B but does not necessarily mean that the element A completely encloses the element B.

The dielectric pattern DI may have a cylindrical shape whose top is opened. The dielectric pattern DI may have a lower segment DLP shaped like a circle when viewed in plan. The dielectric pattern DI may have a sidewall SW that extends in the fourth direction D4 from the lower segment DLP of the dielectric pattern DI. In some embodiments, the sidewall SW of the dielectric pattern DI may be slanted with respect to the fourth direction D4, as illustrated in FIG. 2A. The lower segment DLP of the dielectric pattern DI may directly contact the top surface of the first connection electrode CEL1. The dielectric pattern DI may include a high-k dielectric material such as hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof. It will be understood that "a cylindrical shape" as used herein refers to a shape that includes a bottom portion and two protruding portions protruding from the bottom portion. It will be also understood that "a cylindrical shape" as used herein does not necessarily refer to a shape having two protruding portions that are parallel to each other and may refer to a shape that is the same as or similar to the shape of the dielectric pattern DI shown in FIG. 2A.

The sidewall SW of the dielectric pattern DI may include an outer sidewall OSW and an inner sidewall ISW. The support layer SUP may directly contact an upper portion of the outer sidewall OSW of the dielectric pattern DI, for example, as illustrated in FIGS. 2A and 2C. The support layer SUP may physically connect the dielectric patterns DI. The first electrode EL1 may be provided on the outer sidewall OSW of the dielectric pattern DI, and the second electrode EL2 may be provided on the inner sidewall ISW of the dielectric pattern DI. The first and second electrodes EL1 and EL2 may include, for example, metal or conductive metal nitride. For example, the first and second electrodes EL1 and EL2 may include the same material as that of the first connection electrode CEL1.

The first electrode EL1 may cover the upper sidewall USW of the first connection electrode CEL1 and the outer sidewall OSW of the dielectric pattern DI. The first electrode EL1 may have a cylindrical shape whose bottom and top are opened. The first electrode EU may upwardly (e.g., vertically) extend along the outer sidewall OSW of the dielectric pattern DI. The first electrode EL1 may extend along the outer sidewall OSW of the dielectric pattern DI from the upper sidewall USW of the first connection electrode CEL1 toward the support layer SUP. The first electrode EL1 may not cover the top surface of the etch stop layer ESL. The first electrode EL1 may not cover a bottom surface of the support layer SUP.

The second electrode EL2 may cover a top surface DTS of the lower segment DLP of the dielectric pattern DI and the inner sidewall ISW of the dielectric pattern DI. The second electrode EL2 may have a cylindrical shape whose top is opened. The second electrode EL2 may upwardly (e.g., vertically) extend along the inner sidewall ISW of the dielectric pattern DI. The second electrode EL2 may extend along the inner sidewall ISW of the dielectric pattern DI from the top surface DTS of the lower segment DLP of the dielectric pattern DI toward the support layer SUP. The second electrode EL2 may cover a top surface TS of the dielectric pattern DI. The second electrode EL2 may not cover a top surface of the support layer SUP. The top surface TS of the dielectric pattern DI may be coplanar with the top surface of the support layer SUP.

A second connection electrode CEL2 may be provided on the second electrodes EL2 and the support layer SUP. The second connection electrode CEL2 may cover an exposed surface of the second electrode EL2 and an exposed top surface of the support layer SUP. The second connection electrode CEL2 may be formed by a deposition process, such as physical vapor deposition (PVD), whose step coverage may be poor. The second connection electrode CEL2 may include, for example, one or more of a doped semiconductor material, a metallic material, and a metal-semiconductor compound.

A residue pattern RP may be provided on a top surface of a lower segment of the second electrode EL2. The residue pattern RP may be formed simultaneously with the second connection electrode CEL2. Therefore, the residue pattern RP may include the same material as that of the second connection electrode CEL2. It will be understood that "formed simultaneously" (or similar language) as used herein refers to formed in a same fabrication step, at approximately (but not necessarily exactly) the same time.

Although not shown, a plurality of connection line layers may be provided on the second connection electrode CEL2. A wiring line in the connection line layer may be electrically connected through a contact plug to the second connection electrode CEL2. In such cases, one or more wiring lines in the connection line layer may be electrically connected to the second electrodes EL2 of the capacitors CAP.

According to some example embodiments of the present inventive concepts, the capacitor CAP may include the dielectric pattern DI shaped like an open cylinder, the first electrode EL1 covering the outer sidewall OSW of the dielectric pattern DI, and the second electrode EL2 covering the inner sidewall ISW of the dielectric pattern DI. The capacitor CAP may thus have a relatively small diameter. The small diameter of the capacitor CAP may increase an integration density of a semiconductor device.

FIGS. 3, 5, 7, 9, 11, 13, 15, 17, 19, 21, and 23 illustrate plan views showing a method of fabricating a semiconductor device according to some example embodiments of the present inventive concepts. FIGS. 4A, 6A, 8A, 10A, 12A, 14A, 16A, 18A, 20A, 22A, and 24A illustrate cross-sectional views taken along line A-A' of FIGS. 3, 5, 7, 9, 11, 13, 15, 17, 19, 21, and 23, respectively. FIGS. 4B, 6B, 8B, 10B, 12B, 14B, 16B, 18B, 20B, 22B, and 24B illustrate cross-sectional views taken along line B-B' of FIGS. 3, 5, 7, 9, 11, 13, 15, 17, 19, 21, and 23, respectively. FIGS. 4C, 6C, 8C, 10C, 12C, 14C, 16C, 18C, 20C, 22C, and 24C illustrate cross-sectional views taken along line C-C' of FIGS. 3, 5, 7, 9, 11, 13, 15, 17, 19, 21, and 23, respectively.

Referring to FIGS. 3 and 4A to 4C, an upper portion of a substrate 100 may be patterned (e.g., etched) to form active patterns ACT. Each of the active patterns ACT may extend (e.g., extend longitudinally) in a third direction D3 parallel to a top surface 100_T of the substrate 100. The active patterns ACT may be two-dimensionally arranged along a first direction D1 and a second direction D2. The active patterns ACT may be spaced apart from each other in the third direction D3.

First and second trenches TR1 and TR2 may be defined between the active patterns ACT. The first trench TR1 may be defined between a pair of active patterns ACT adjacent to each other in the second direction D2. The second trench TR2 may be defined between a pair of active patterns ACT adjacent to each other in the third direction D3.

Referring to FIGS. 5 and 6A to 6C, a device isolation layer ST may be formed to fill the first and second trenches TR1 and TR2. In some embodiments, the device isolation layer ST may be formed to completely fill the first and second trenches TR1 and TR2 and to cover the active patterns ACT. A planarization process may be performed on the device isolation layer ST until top surfaces of the active patterns ACT are exposed.

The active patterns ACT and the device isolation layer ST may be patterned to form third trenches TR3. When viewed in plan, each of the third trenches TR3 may have a linear shape extending (e.g., longitudinally extending) in the second direction D2.

Figure 6A:
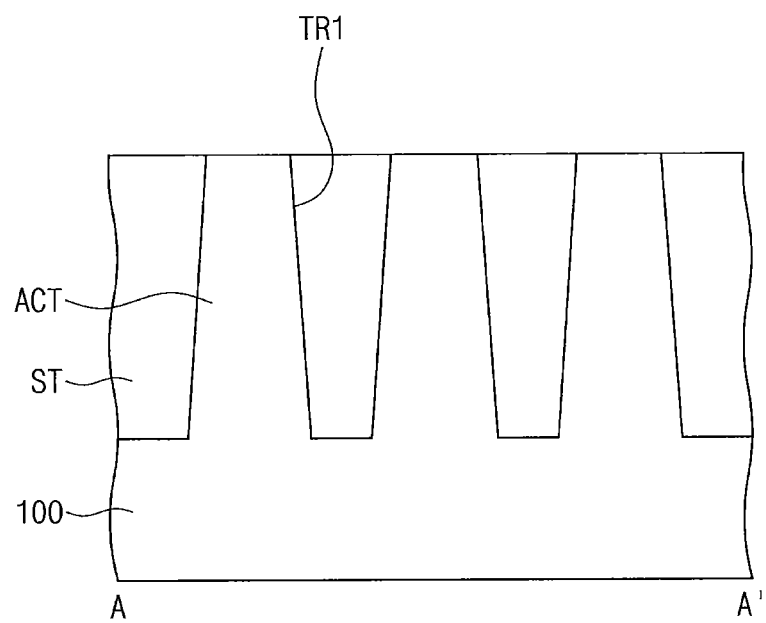
Figure 6B:
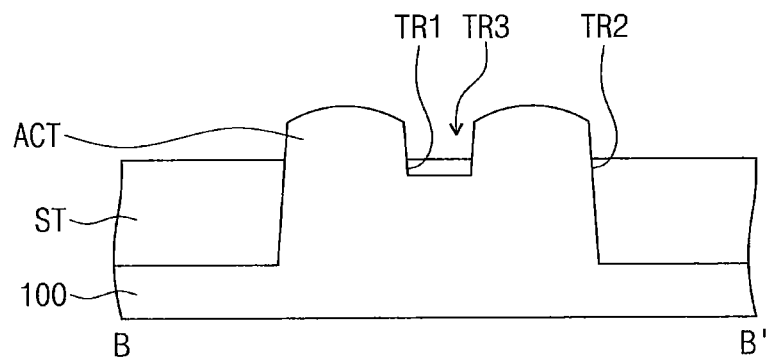
Figure 6C:
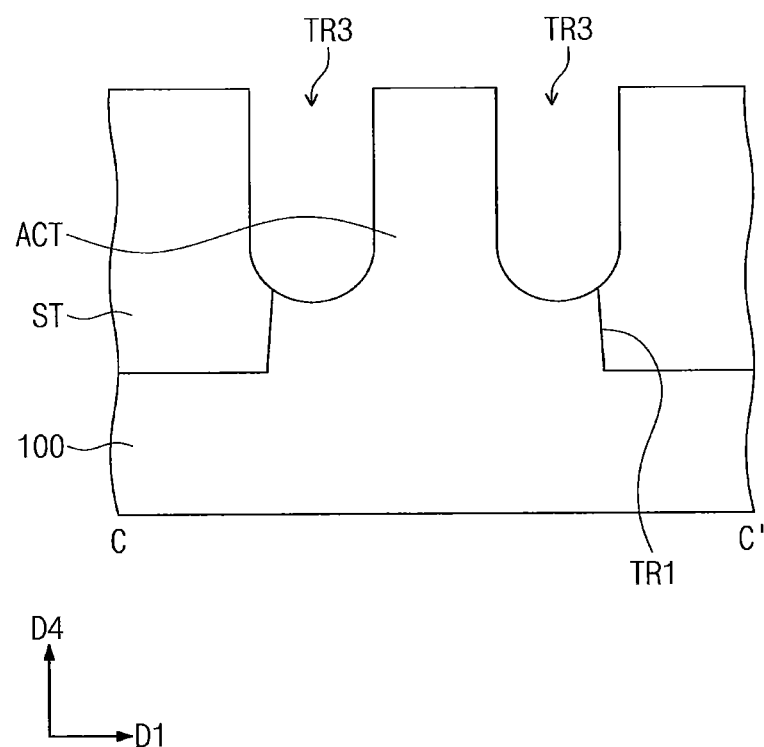
Figure 7:
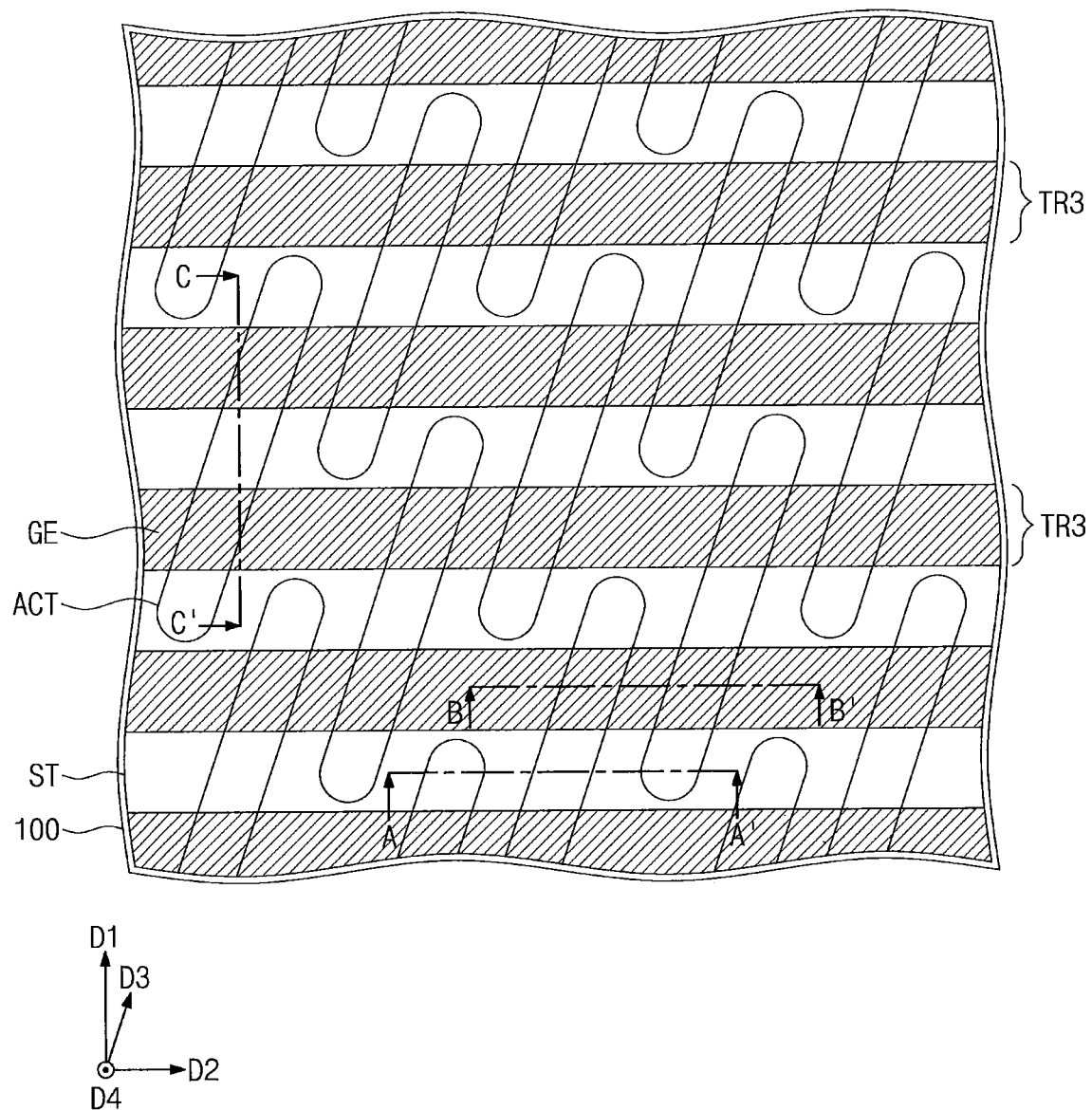
Figure 8A:
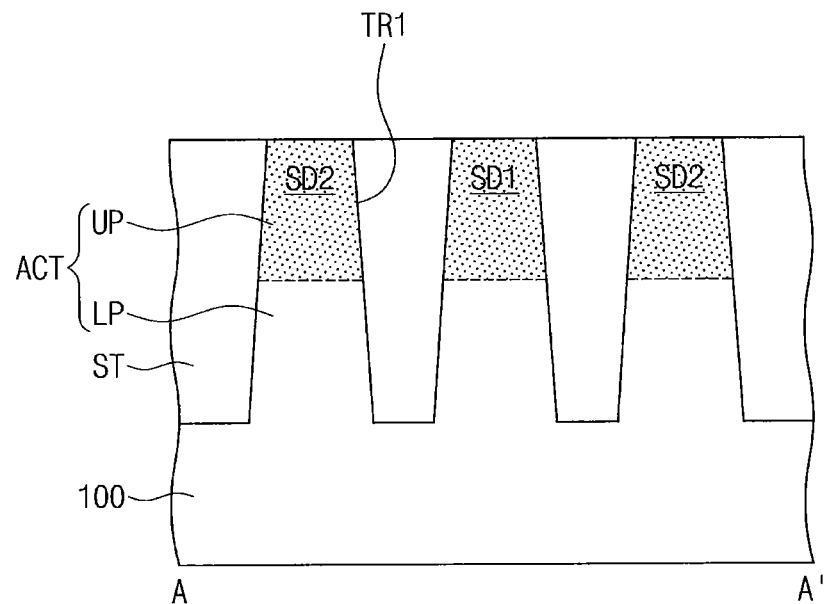
Figure 8B:
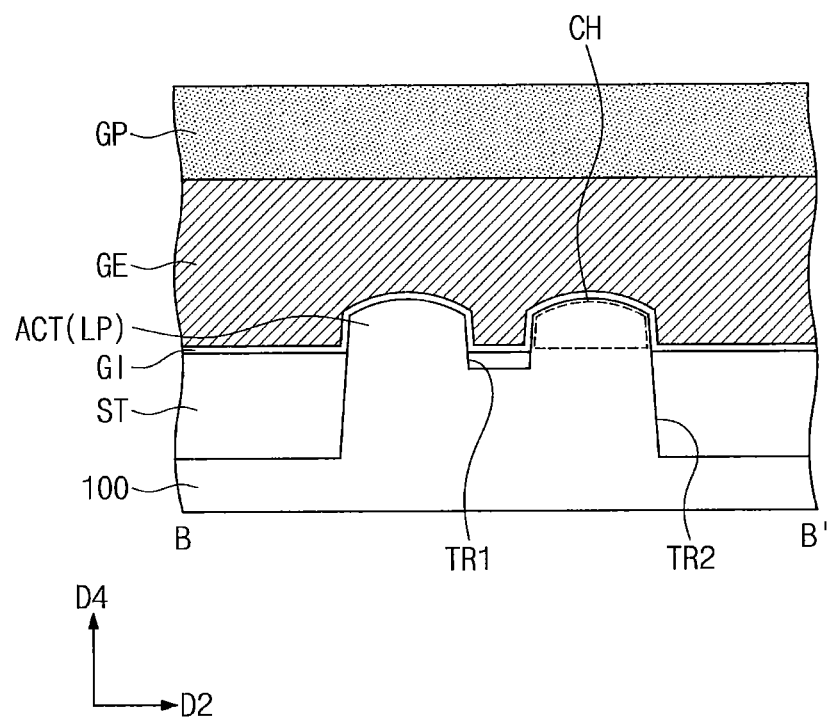
Figure 8C:
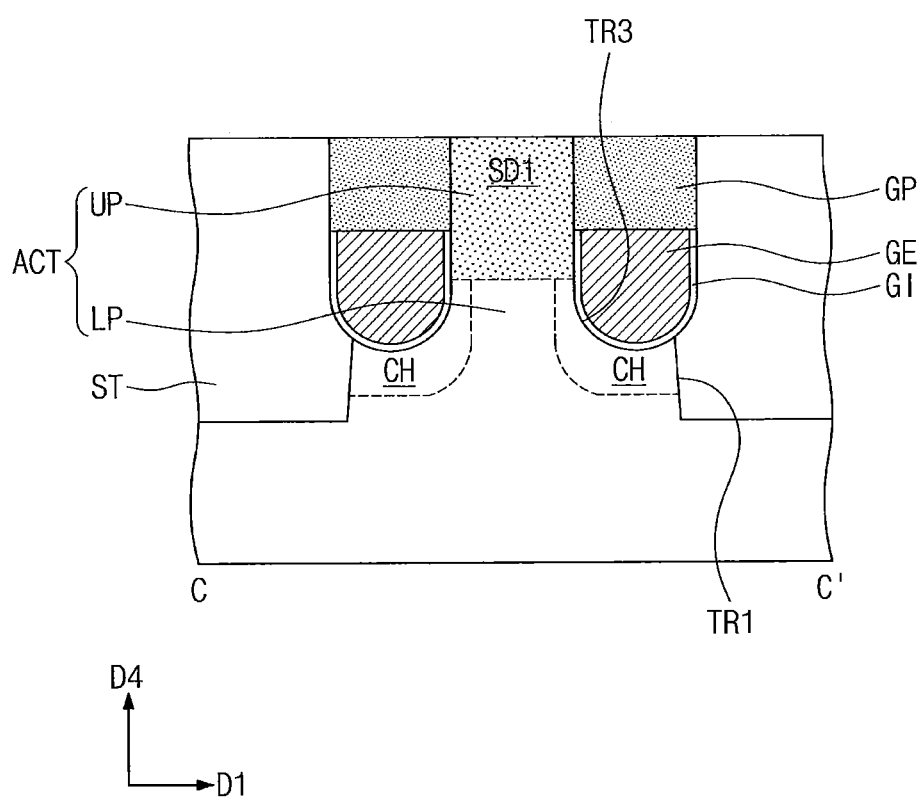
Figure 9:
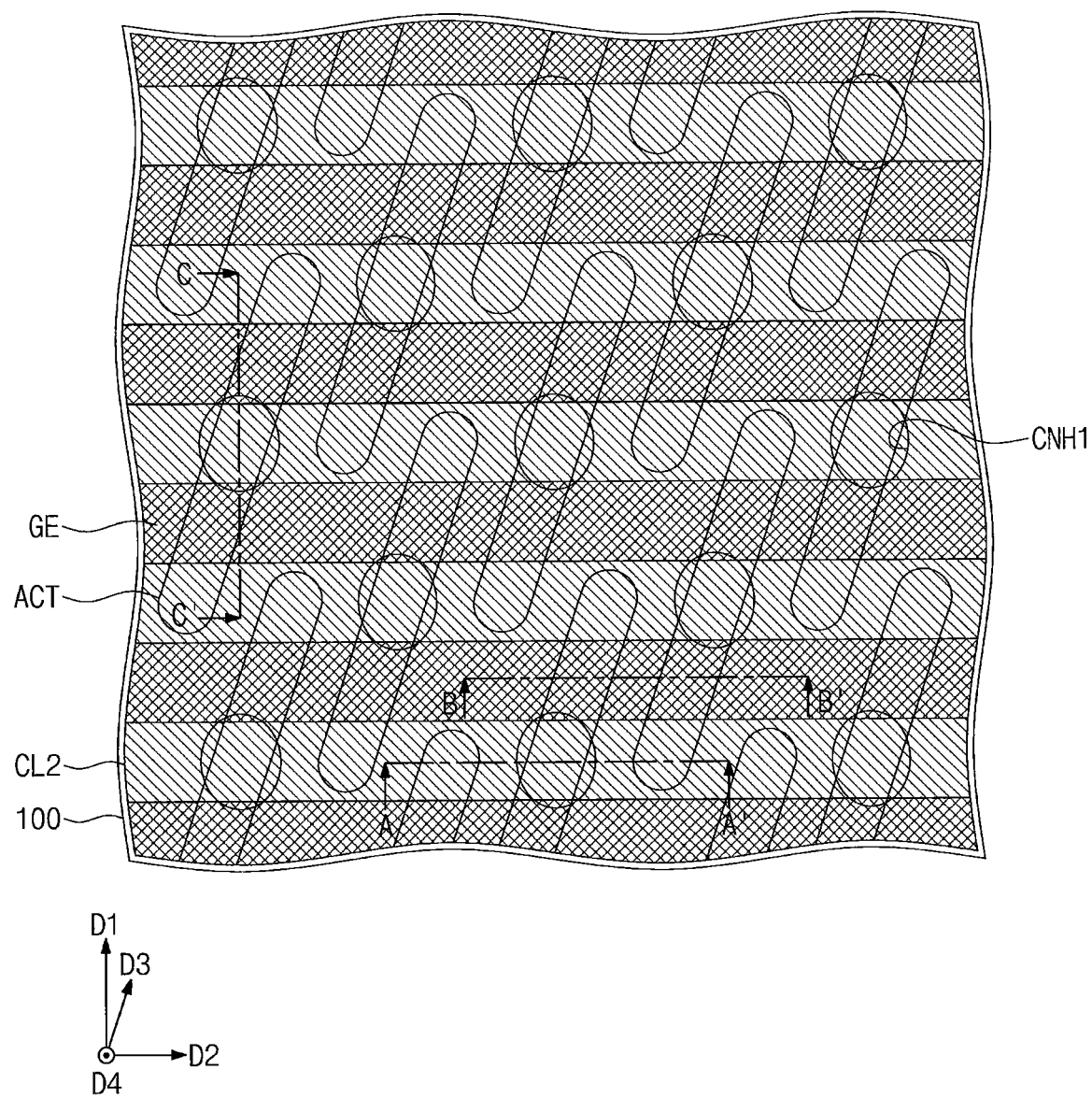
Figure 10A:
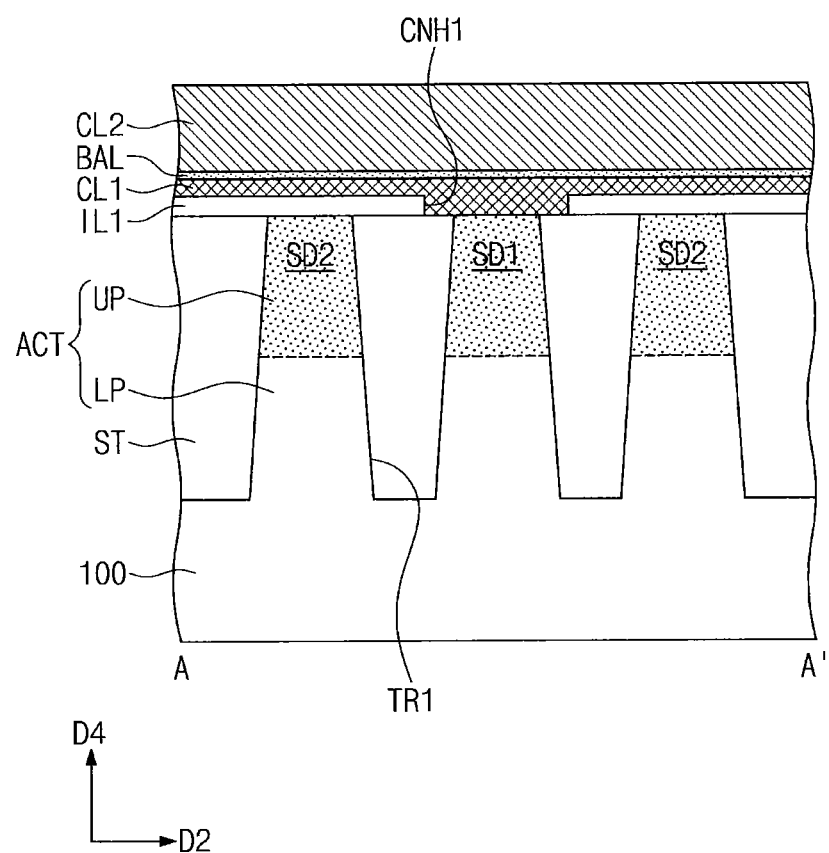
Figure 10B:
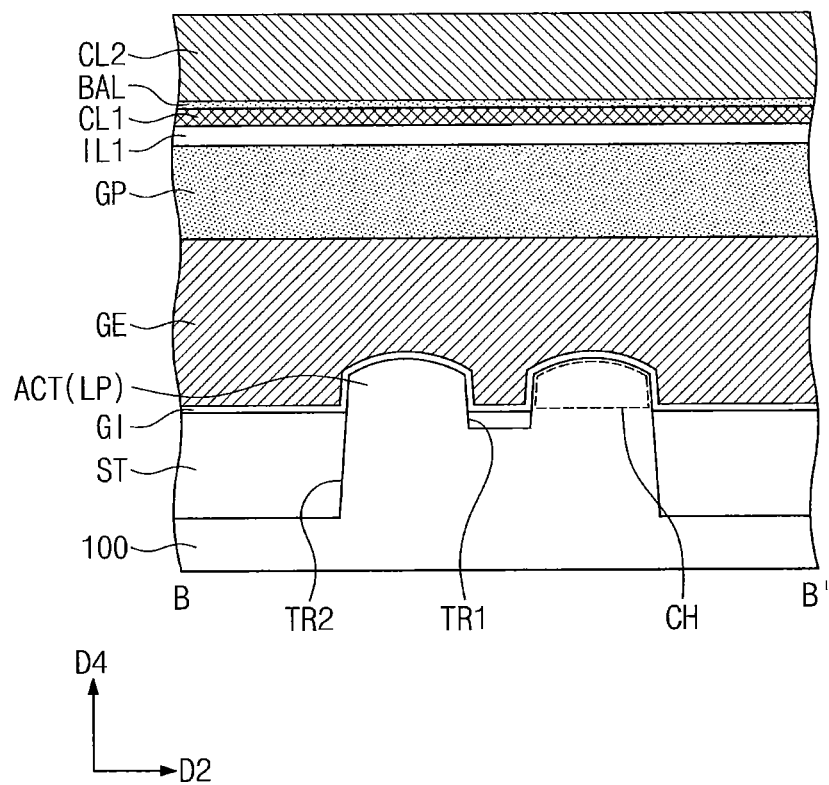
Figure 10C:
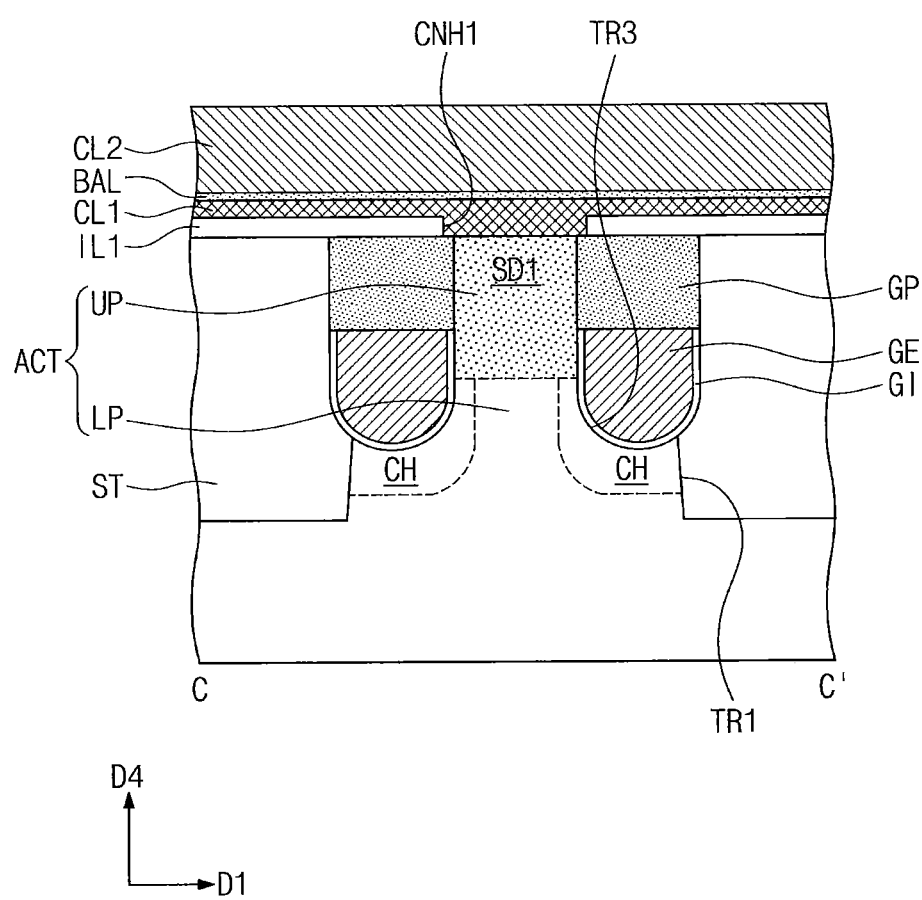

The formation of the third trenches TR3 may include forming a mask layer (e.g., a hard mask pattern) having openings and then using the mask layer as an etching mask to etch the exposed active patterns ACT and the device isolation layer ST. The third trench TR3 may be formed shallower than the first trench TR1. In some embodiments, the third trench TR3 has a depth less than a depth of the first trench TR1, as illustrated in FIG. 6C.

Referring to FIGS. 7 and 8A to 8C, a gate dielectric layer GI, a gate electrode GE, and a gate capping layer GP may be formed in each of the third trenches TR3. For example, the gate dielectric layer GI may be conformally formed in each of the third trenches TR3. The gate dielectric layer GI may include, for example, one or more of a silicon oxide layer, a silicon nitride layer, a silicon oxynitride layer, and a high-k dielectric material.

A conductive layer filling the third trenches TR3 may be formed on the gate dielectric layer GI to form the gate electrodes GE. The conductive layer may include, for example, one or more of metal and conductive metal nitride.

The gate dielectric layer GI and the gate electrode GE may be recessed, and then the gate capping layer GP may be formed on the recessed gate electrode GE. The gate capping layer GP may have a top surface coplanar with that of the active pattern ACT.

An ion implantation process may be performed on the active patterns ACT, so that a first source/drain region SD1 and a pair of second source/drain regions SD2 may be formed in a second segment UP of the active pattern ACT. The pair of second source/drain regions SD2 may be spaced apart in the third direction D3 from each other across the first source/drain region SD1. For example, the first and second source/drain regions SD1 and SD2 may be doped with the same impurity. In some embodiments, the first and second source/drain regions SD1 and SD2 may include impurity atoms (e.g., dopants) that have the same conductivity type.

A channel region CH may be defined in a first segment LP of the active pattern ACT, and the first segment LP is positioned below the gate electrode GE. When viewed in plan, the channel region CH may be interposed between the first source/drain region SD1 and the second source/drain region SD2. The gate electrode GE may be provided on a top surface and opposite sidewalls of the channel region CH.

Referring to FIGS. 9 and 10A to 10C, a first interlayer insulating layer IL1 may be formed on the substrate 100 (e.g., an entire surface of the substrate 100). For example, the first interlayer insulating layer IL1 may include a silicon oxide layer. The first interlayer insulating layer IL1 may be patterned (e.g., etched) to form first contact holes CNH1 exposing the first source/drain regions SD1 of the active patterns ACT.

A first conductive layer CL1, a barrier layer BAL, and a second conductive layer CL2 may be sequentially formed on the first interlayer insulating layer IL1. The first conductive layer CL1 may fill the first contact holes CNH1. For example, the first conductive layer CL1 may contact the first source/drain regions SD1 of the active patterns ACT. The first interlayer insulating layer IL1 may vertically separate the first conductive layer CL1 from the second source/drain regions SD2 of the active patterns ACT. The first conductive layer CL1 may include, for example, one of a doped semiconductor material, a metallic material, and a metal-semiconductor compound.

The barrier layer BAL may be formed to lie between the first conductive layer CL1 and the second conductive layer CL2. The barrier layer BAL may include, for example, conductive metal nitride. The second conductive layer CL2 may include, for example, a metallic material. The barrier layer BAL may reduce or may possibly prevent a metallic material in the second conductive layer CL2 from diffusing toward the first conductive layer CL1.

Referring to FIGS. 11 and 12A to 12C, line structures LST extending (e.g., extending longitudinally) in the first direction D1 may be formed on the first interlayer insulating layer IL1. The line structures LST may be spaced apart from each other in the second direction D2.

For example, mask patterns MP may be formed on the second conductive layer CL2. The mask patterns MP may be formed to have a linear shape extending (e.g., extending longitudinally) in the first direction D1. For example, the mask patterns MP may include a silicon nitride layer or a silicon oxynitride layer.

The mask patterns MP may be used as an etching mask to sequentially etch the second conductive layer CL2, the barrier layer BAL, and the first conductive layer CL1 to respectively form a bit line BL, a barrier pattern BP, and a conductive pattern CP. The mask pattern MP, the bit line BL, the barrier pattern BP, and the conductive pattern CP may vertically overlap each other. The mask pattern MP, the bit line BL, the barrier pattern BP, and the conductive pattern CP may constitute the line structure LST. When viewed in plan, the bit lines BL may extend while intersecting the gate electrodes GE.

The conductive pattern CP may include contact parts CNP filling the first contact holes CNH1. The conductive pattern CP may be connected through the contact part CNP to the first source/drain region SD1. For example, the bit line BL may be electrically connected through the conductive pattern CP to the first source/drain region SD1.

A pair of spacers SP may be formed on opposite sidewalls of each of the line structures LST. The formation of the spacers SP may include conformally forming a spacer layer on the substrate 100 (e.g., the entire surface of the substrate 100) and performing an anisotropic etching process on the spacer layer.

Referring to FIGS. 13 and 14A to 14C, a second interlayer insulating layer IL2 may be formed on the substrate 100. For example, the second interlayer insulating layer IL2 may include a silicon oxide layer. A planarization process may be performed on the second interlayer insulating layer IL2 until top surfaces of the mask patterns MP are exposed.

The second and first interlayer insulating layers IL2 and IL1 may be patterned (e.g., etched) to form second contact holes CNH2 exposing the second source/drain regions SD2 of the active patterns ACT. The second contact holes CNH2 may be filled with a conductive material such that contacts CNT may be formed in corresponding second contact holes CNH2. The contacts CNT may be connected to the second source/drain regions SD2.

Referring to FIGS. 15 and 16A to 16C, a third interlayer insulating layer IL3, an etch stop layer ESL, and a sacrificial layer SAC may be formed and sequentially stacked on the second interlayer insulating layer IL2. For example, the third interlayer insulating layer IL3 may include a silicon oxide layer, the etch stop layer ESL may include a silicon nitride layer, and the sacrificial layer SAC may include a silicon oxide layer.

Figure 16A:
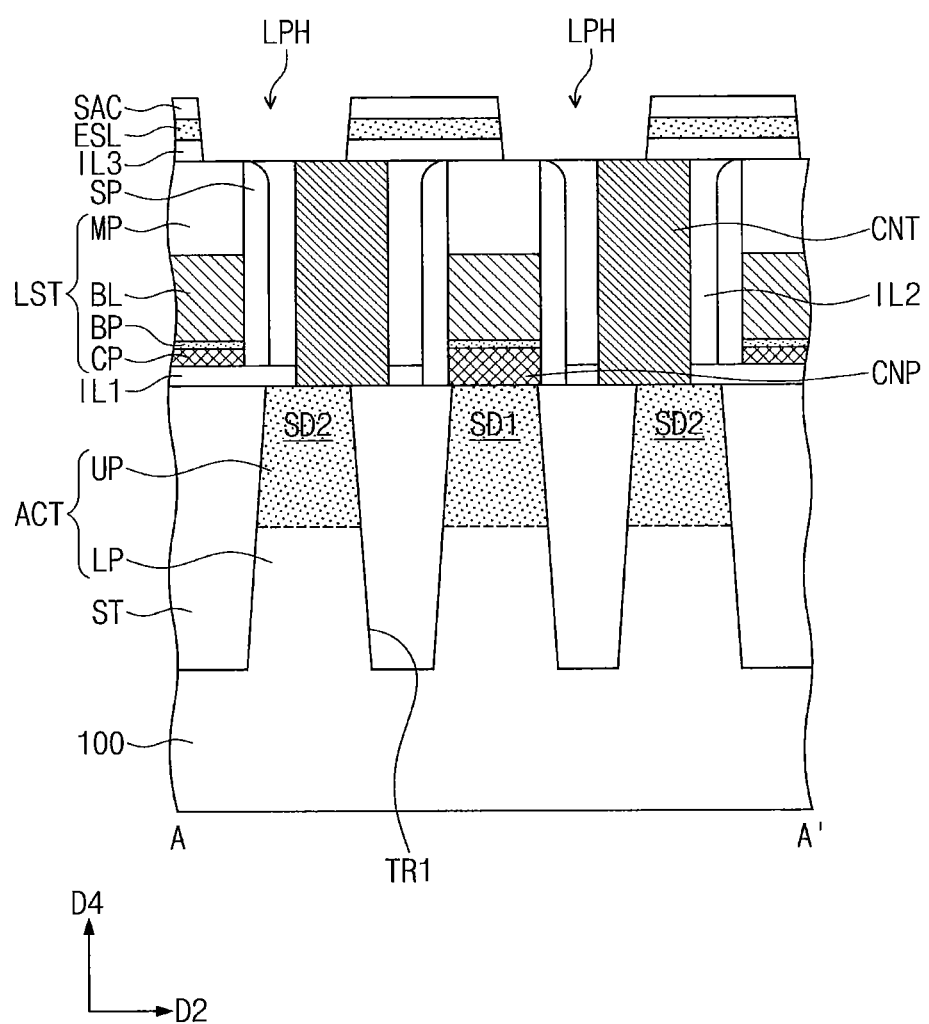
Figure 16B:
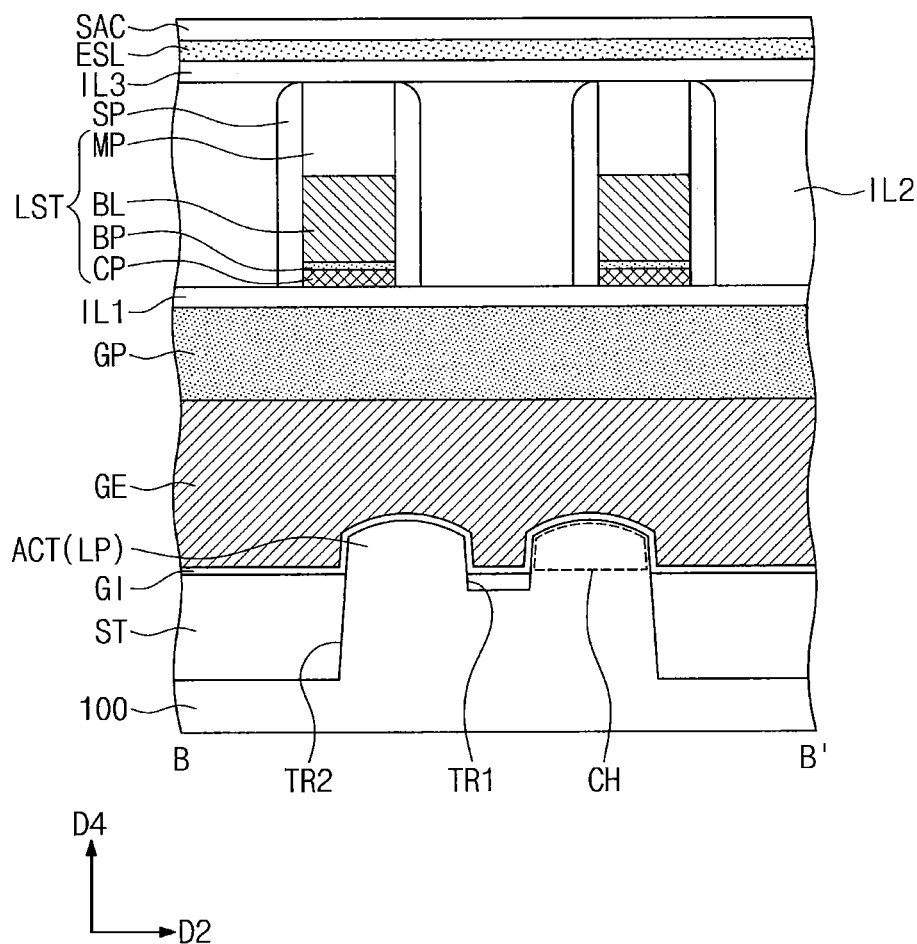
Figure 16C:
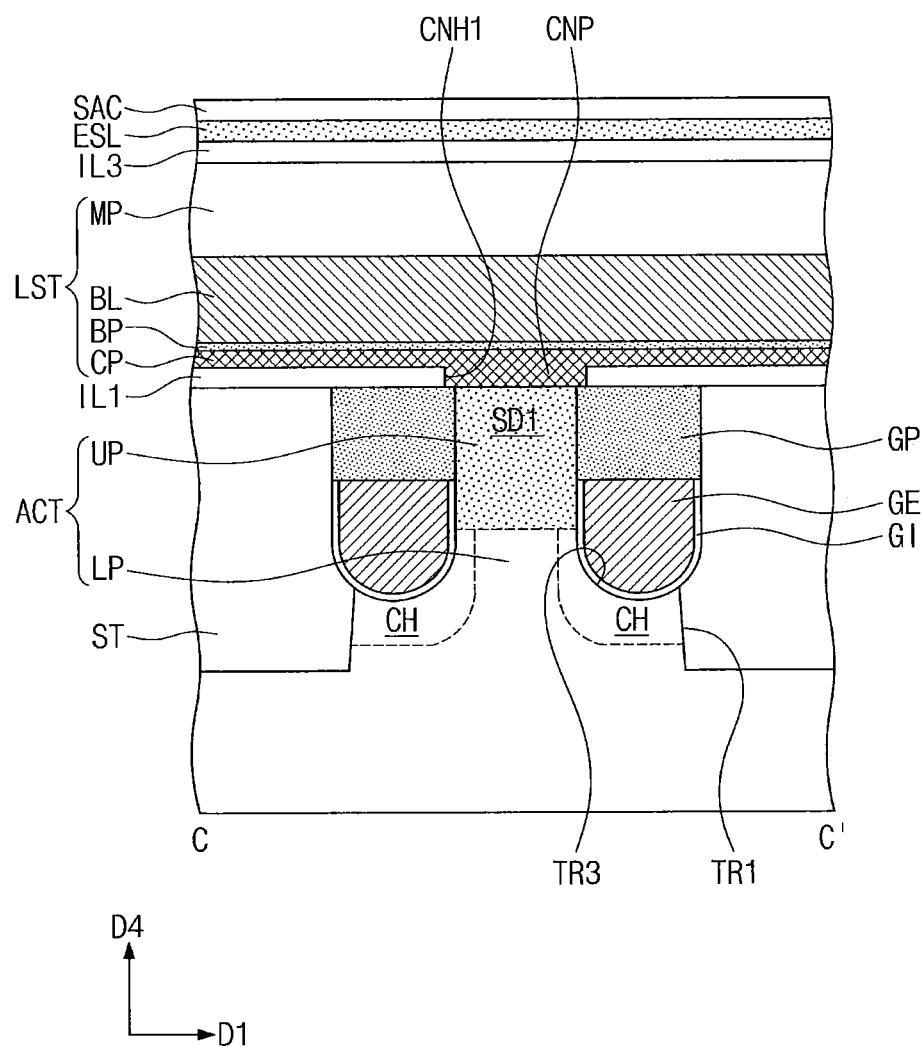
Figure 17:
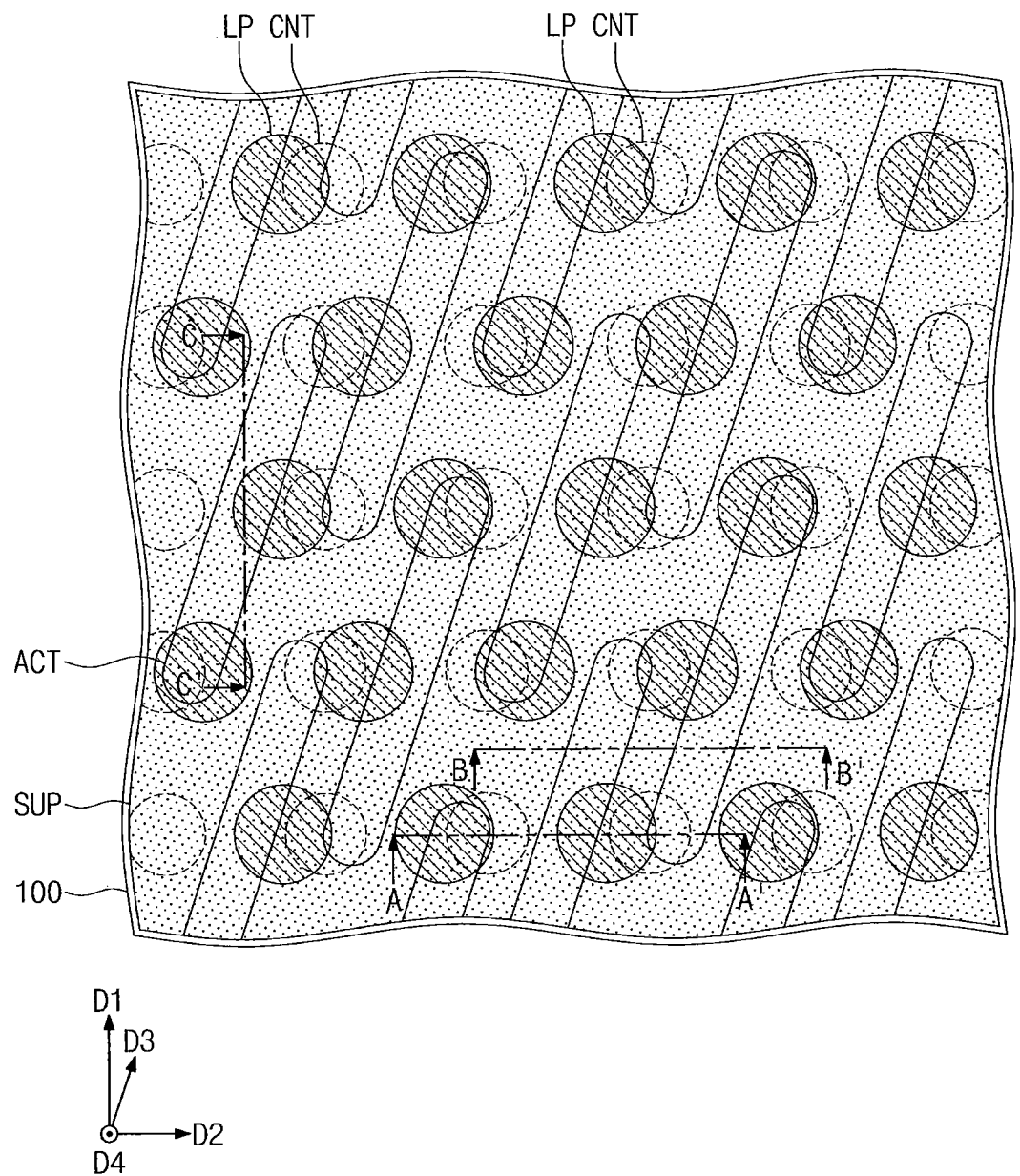
Figure 18A:
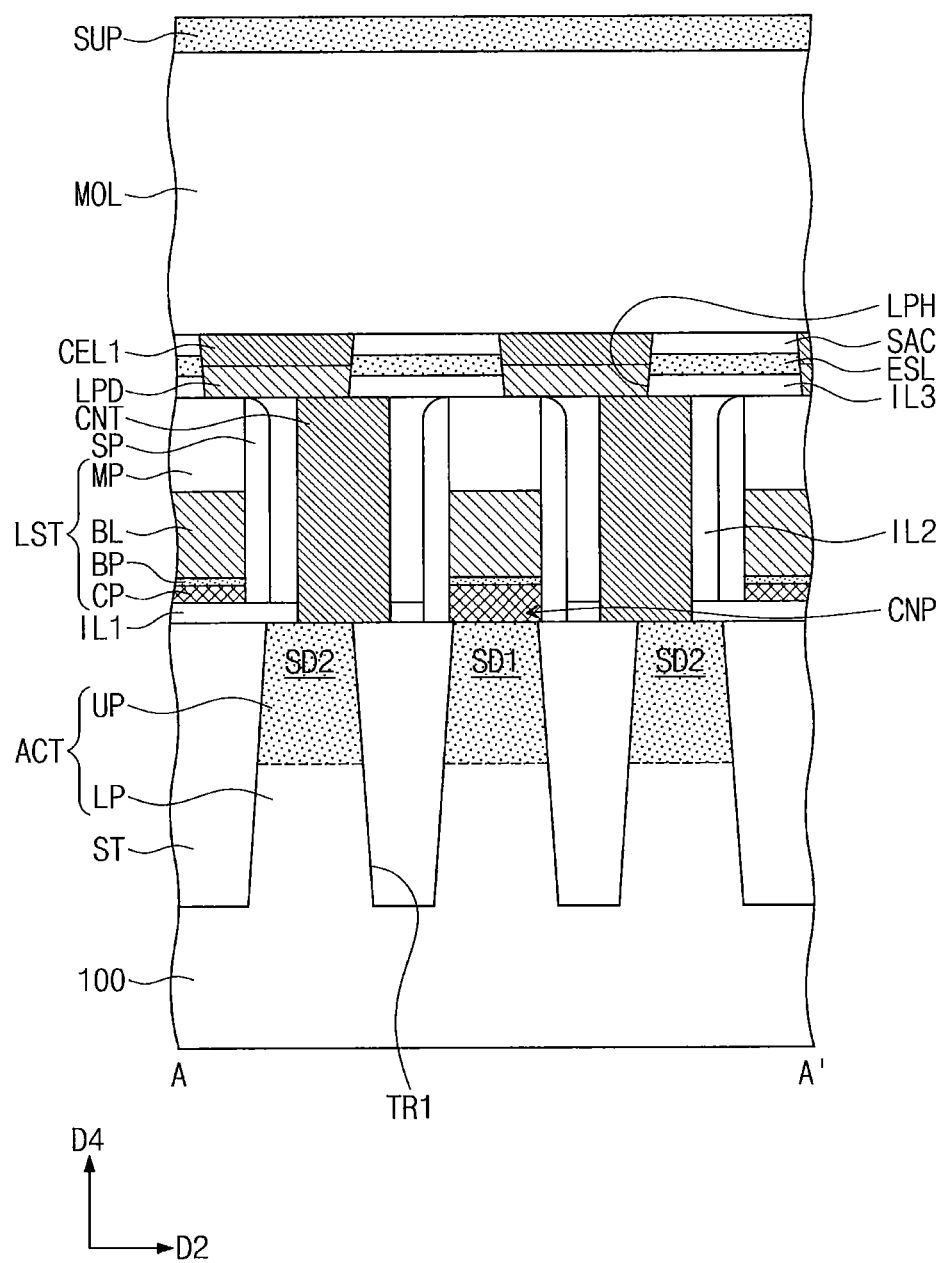
Figure 18B:
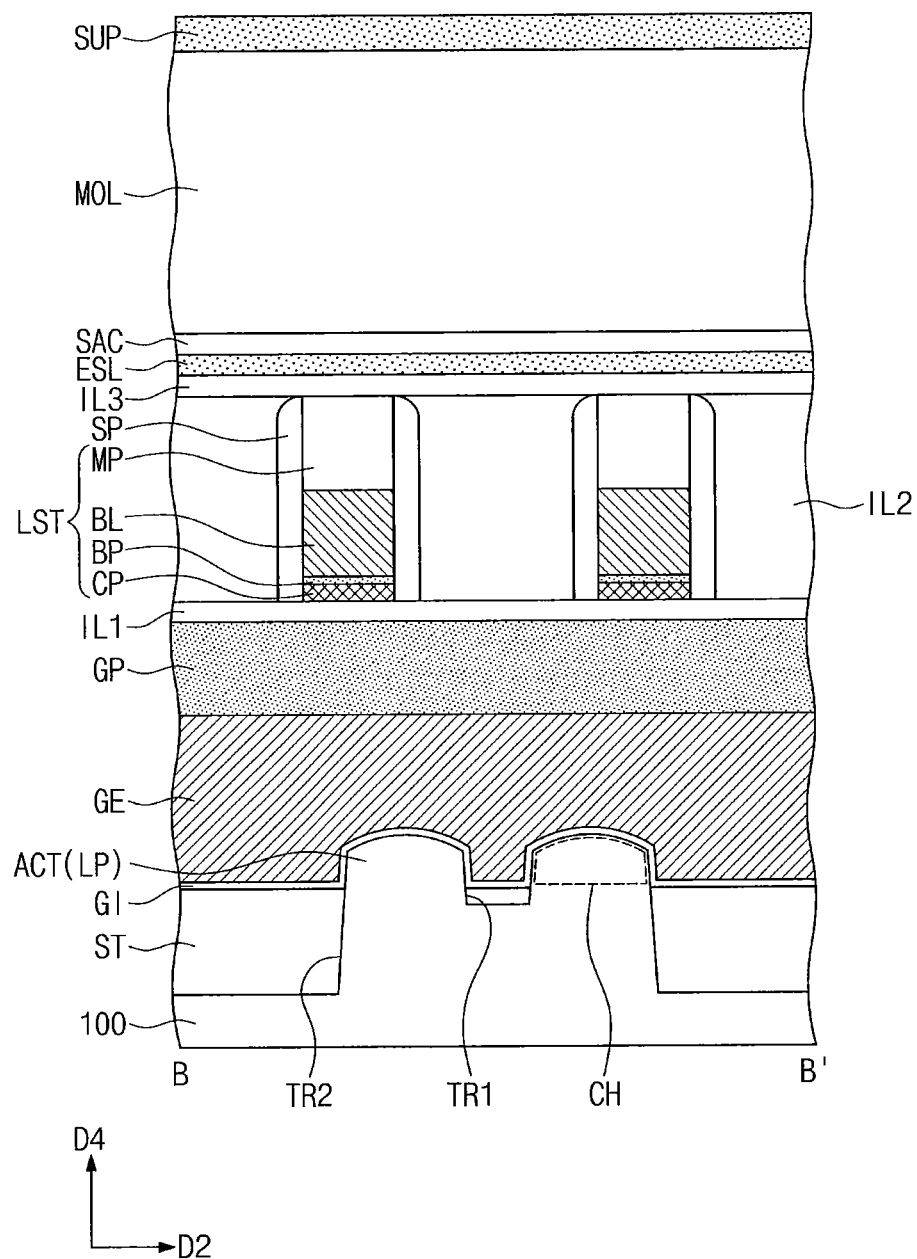
Figure 18C:
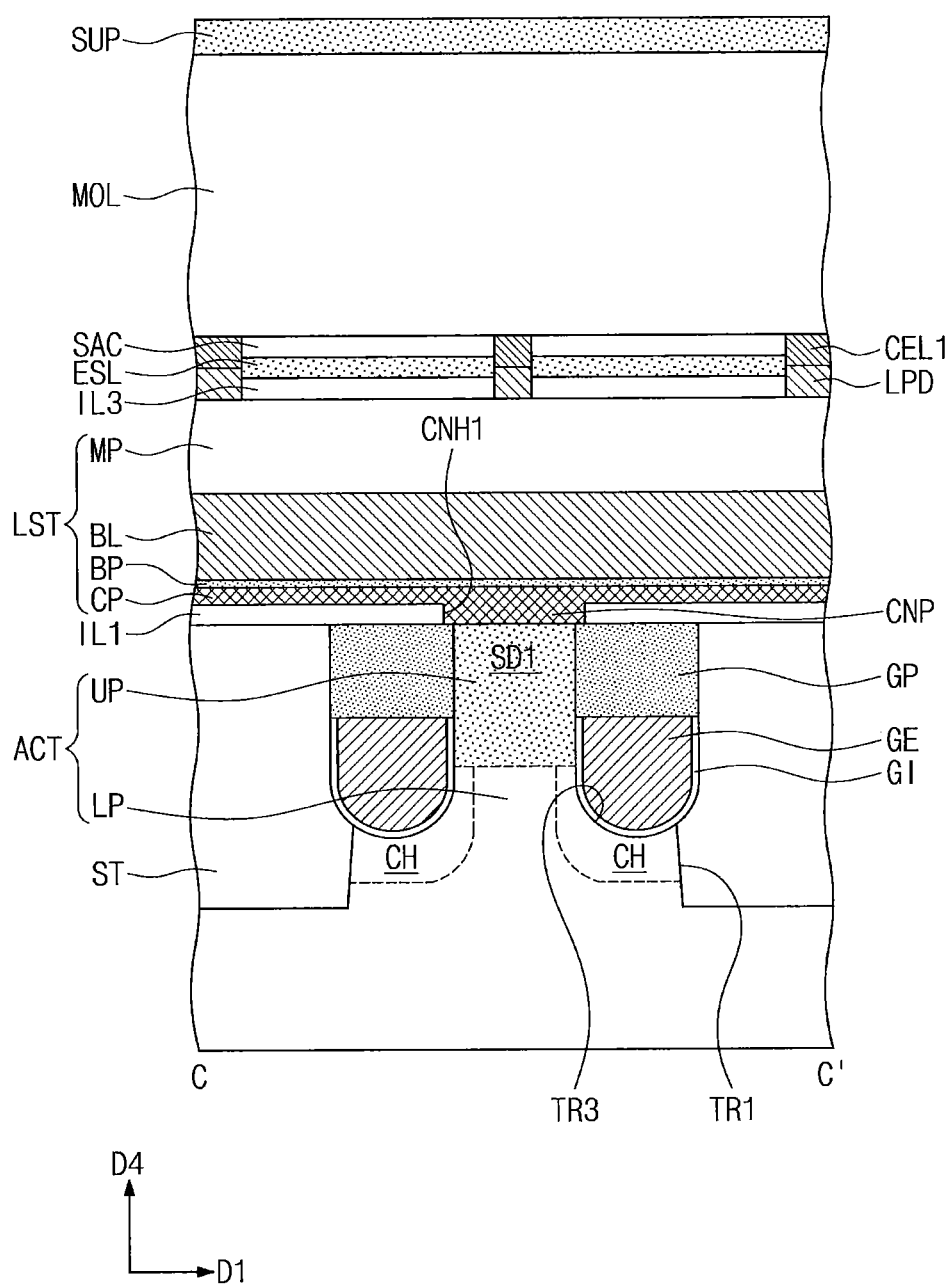
Figure 19:
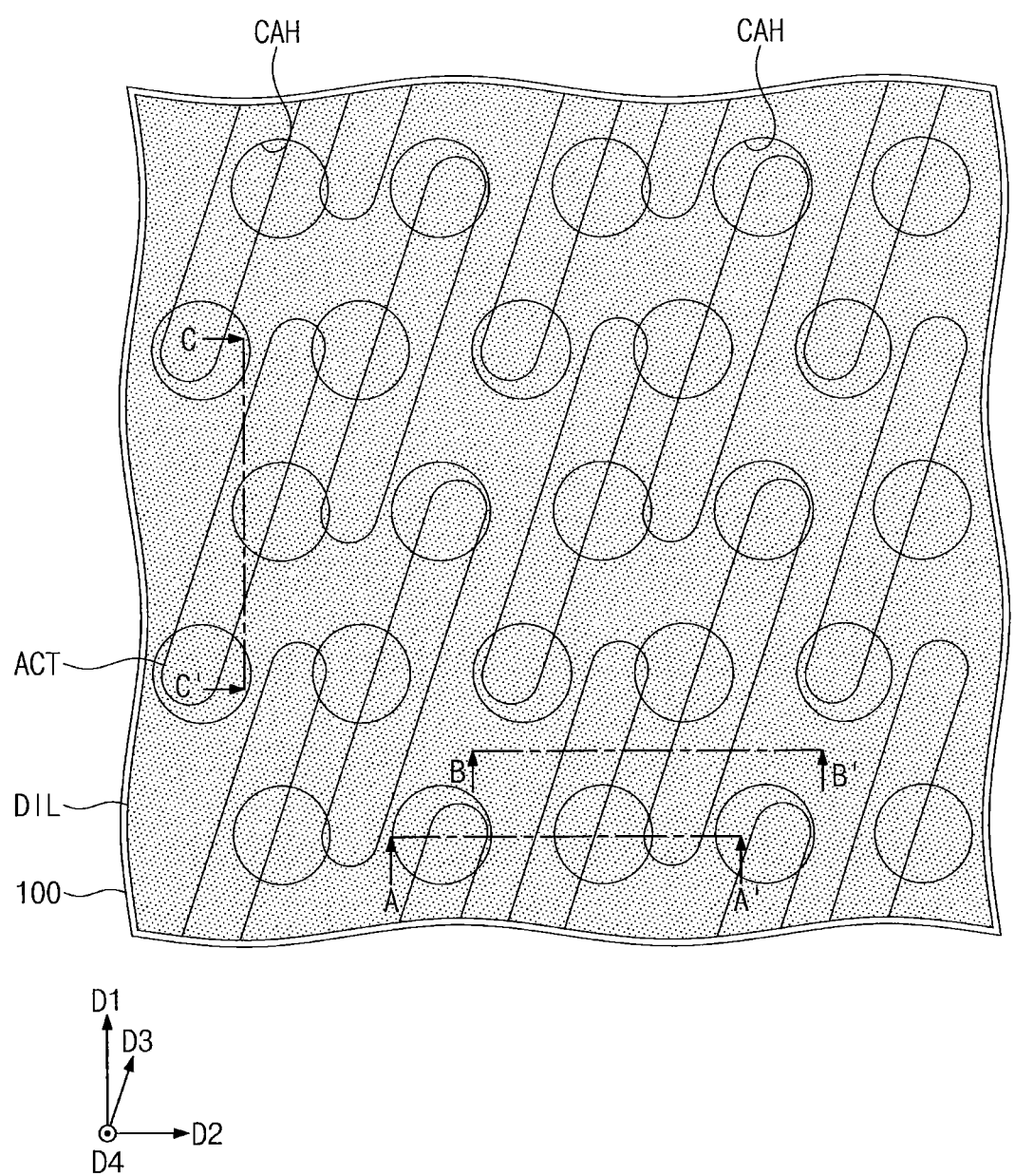
Figure 20A:
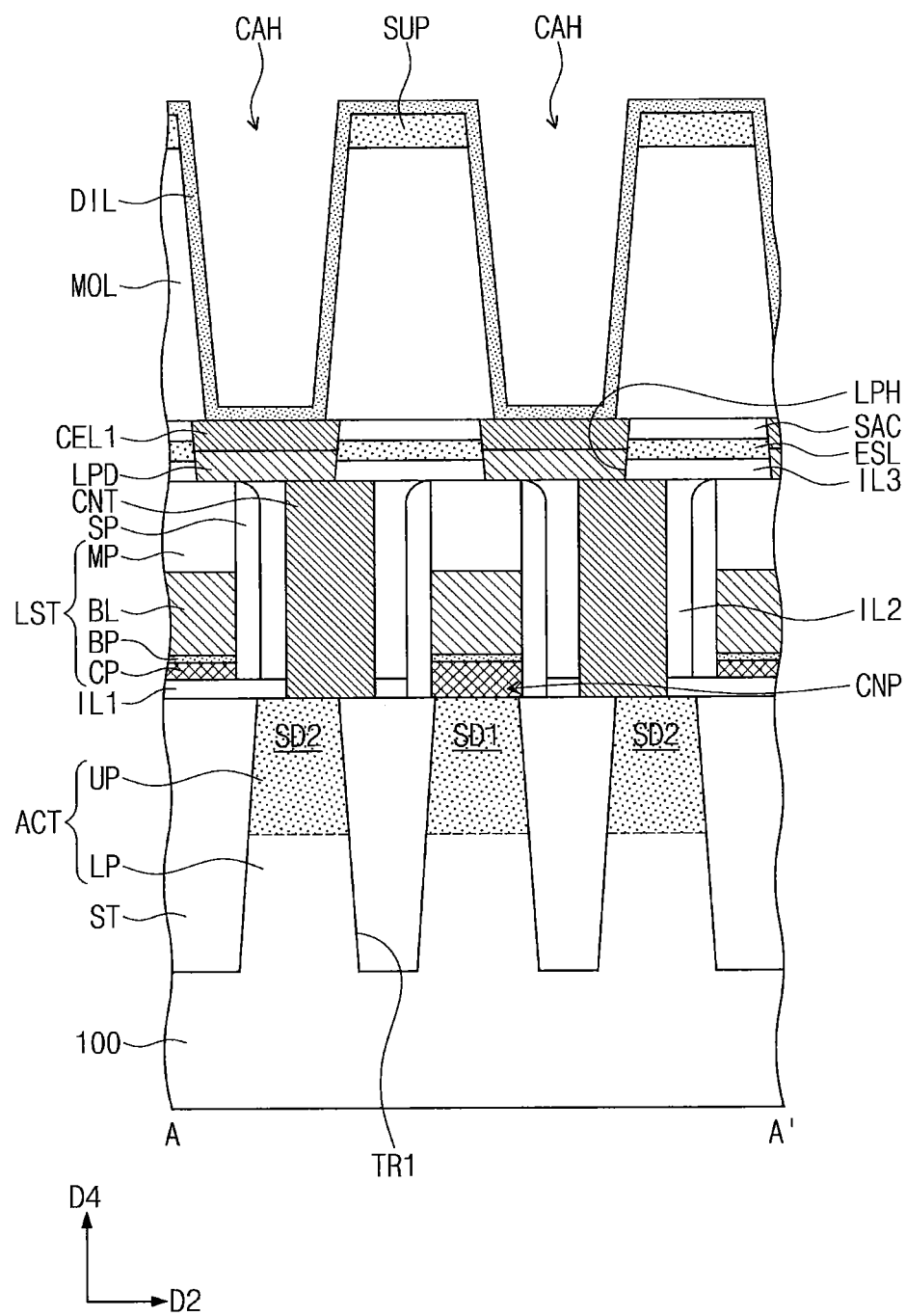
Figure 20B:
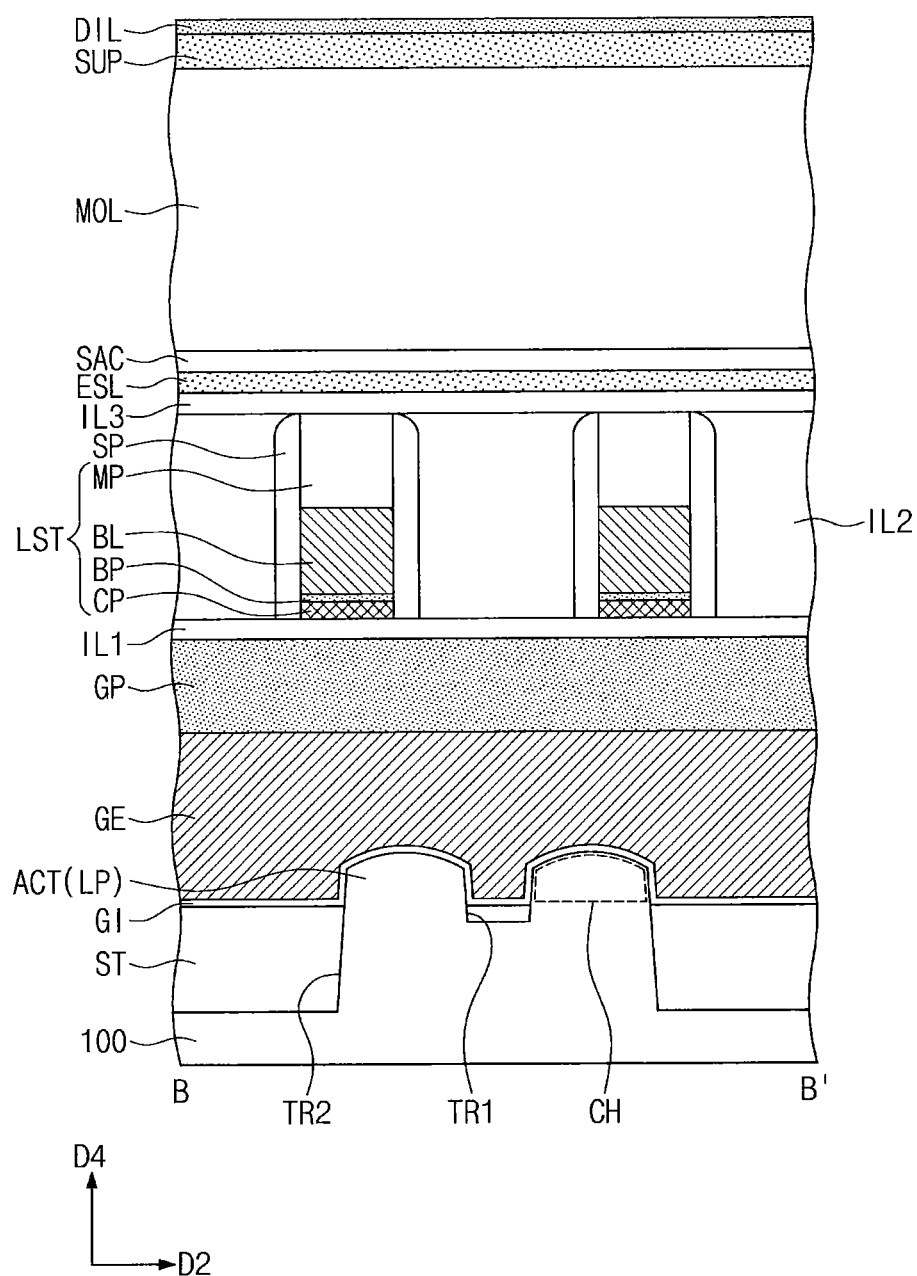
Figure 20C:
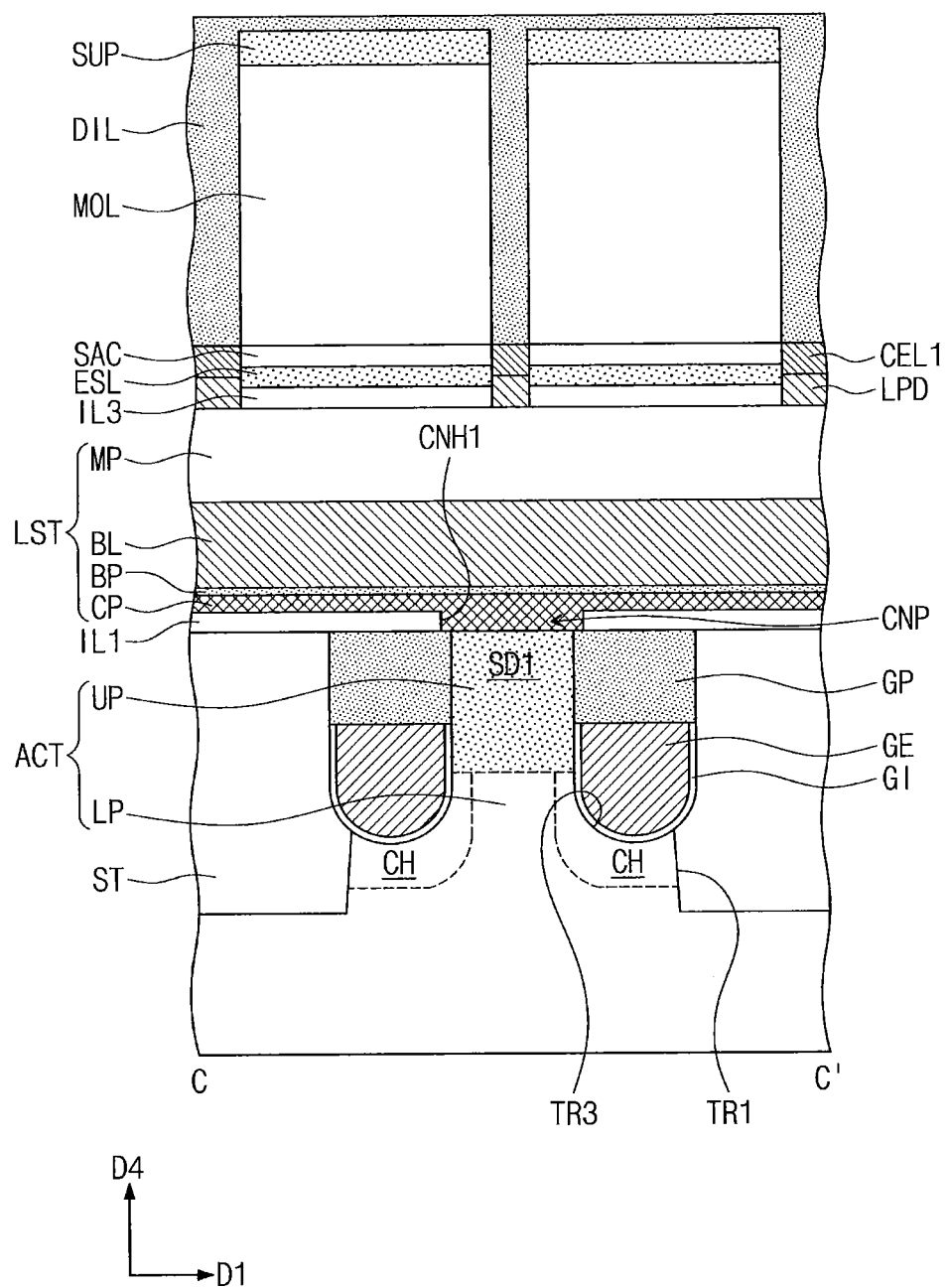
Figure 21:
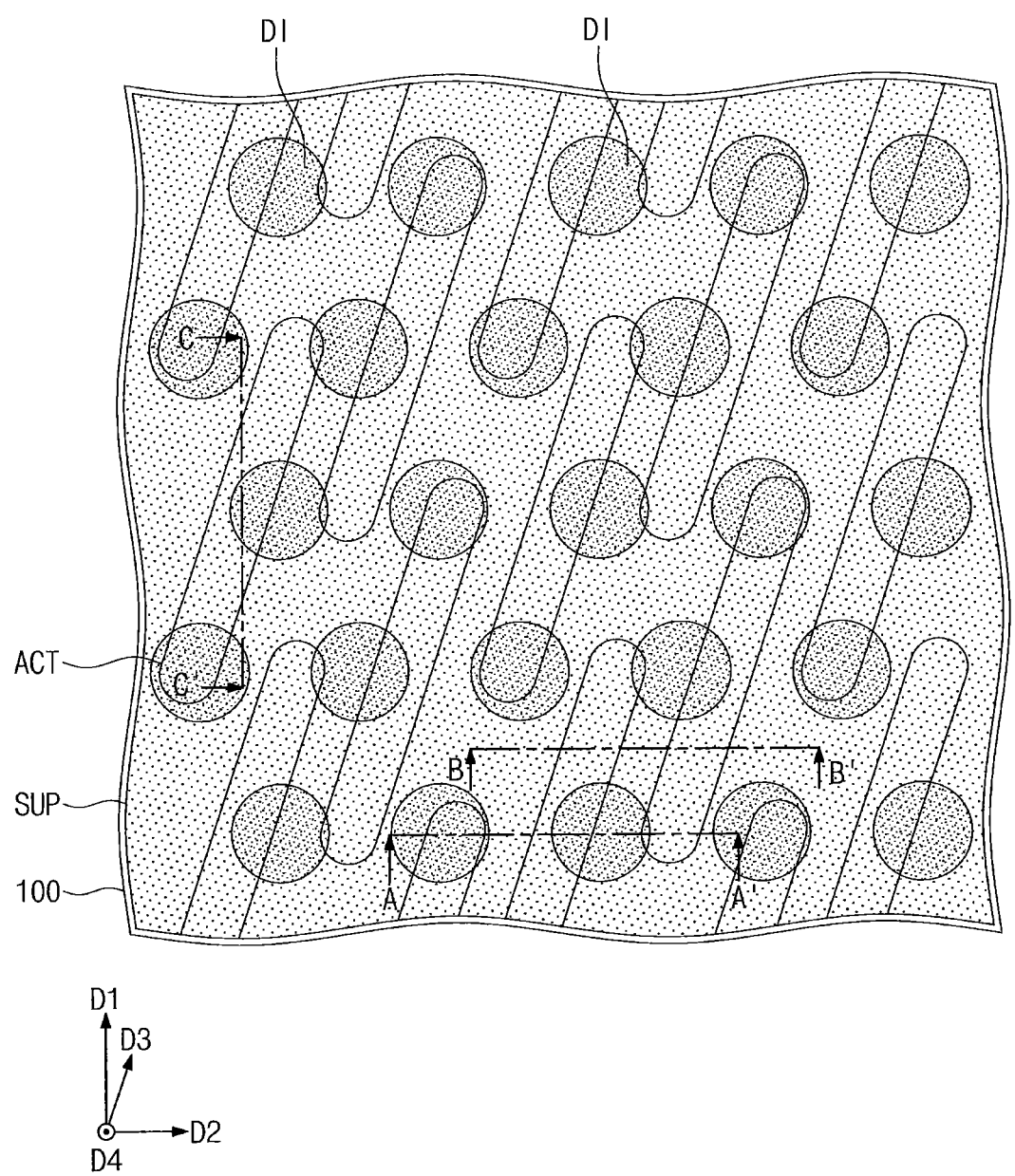
Figure 22A:
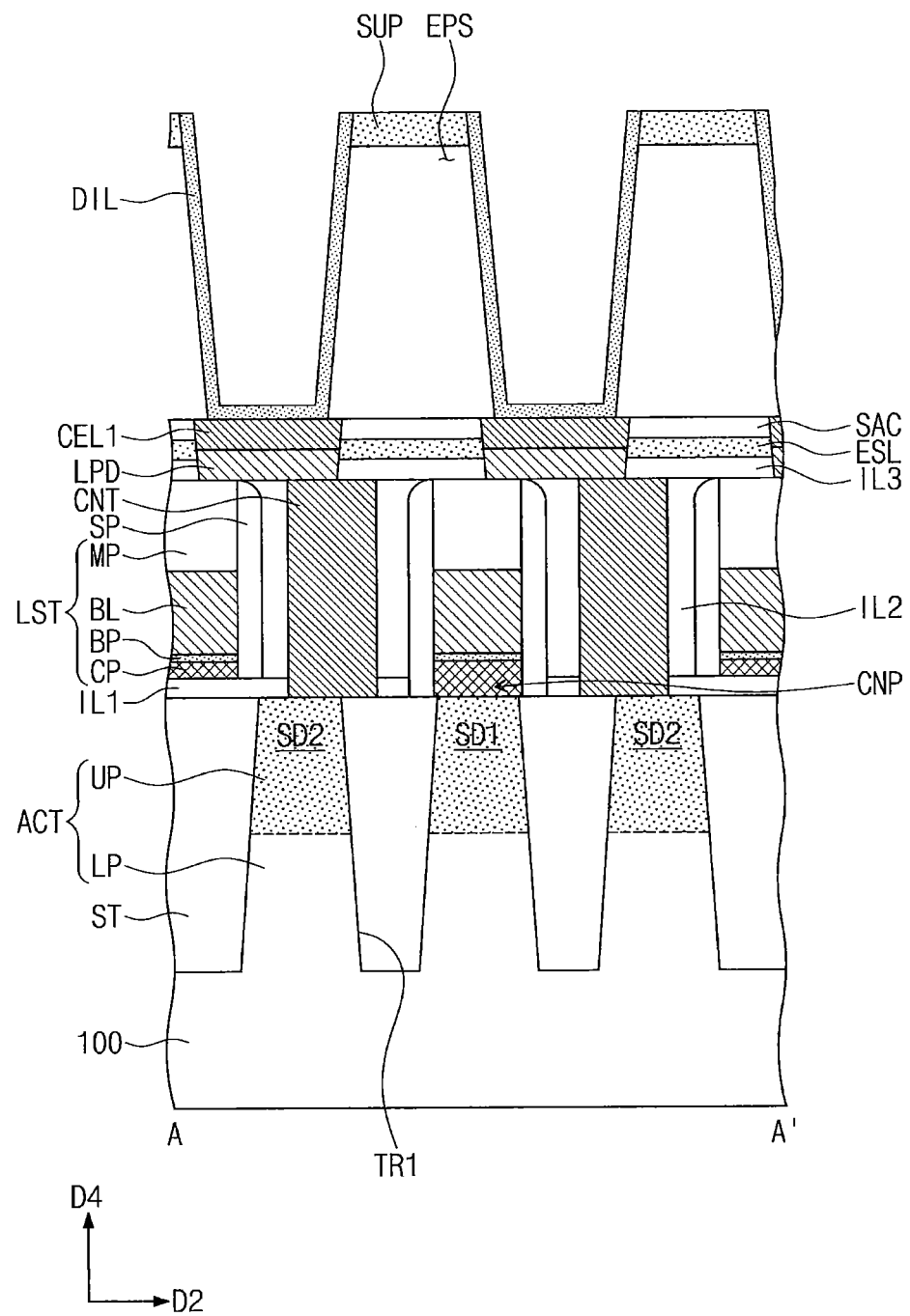
Figure 22B:
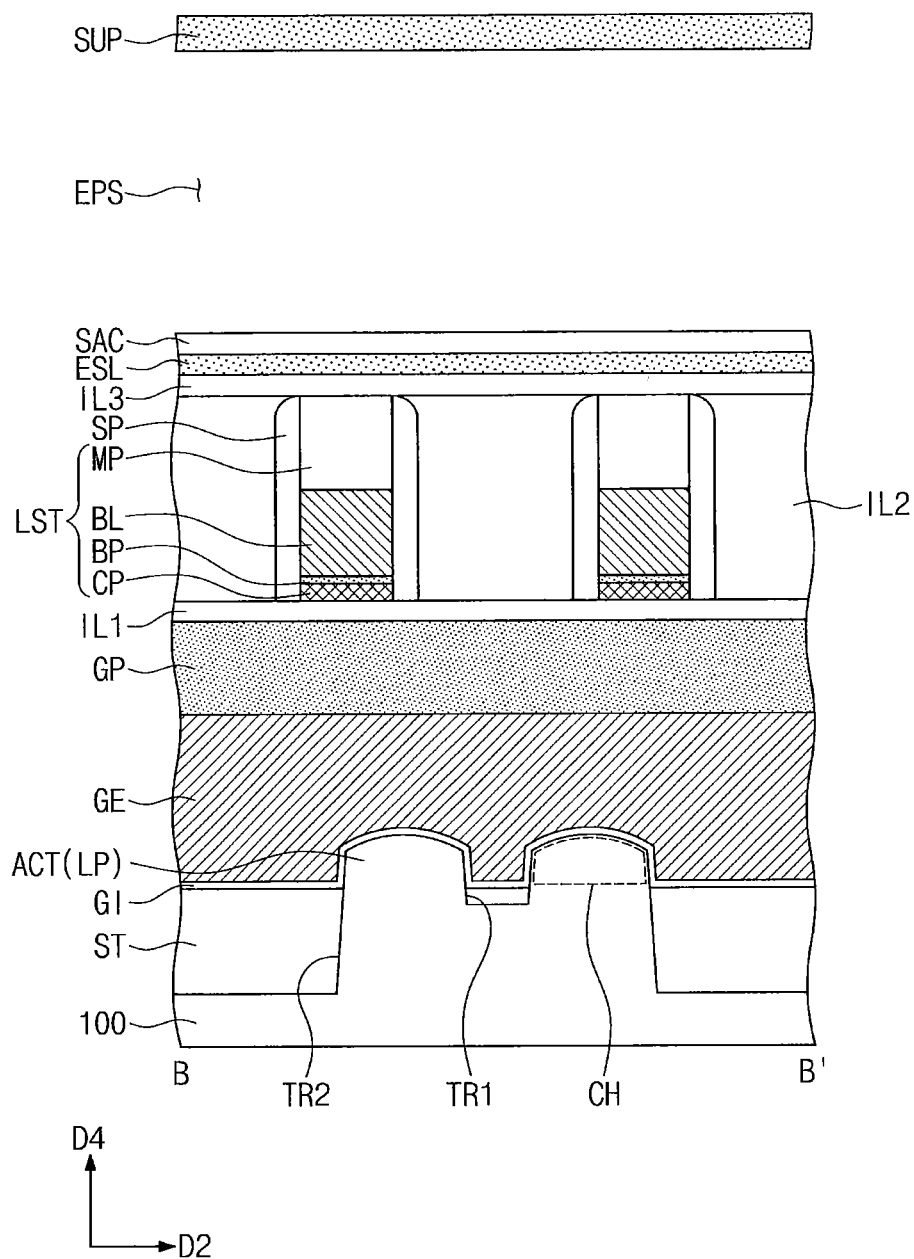
Figure 22C:
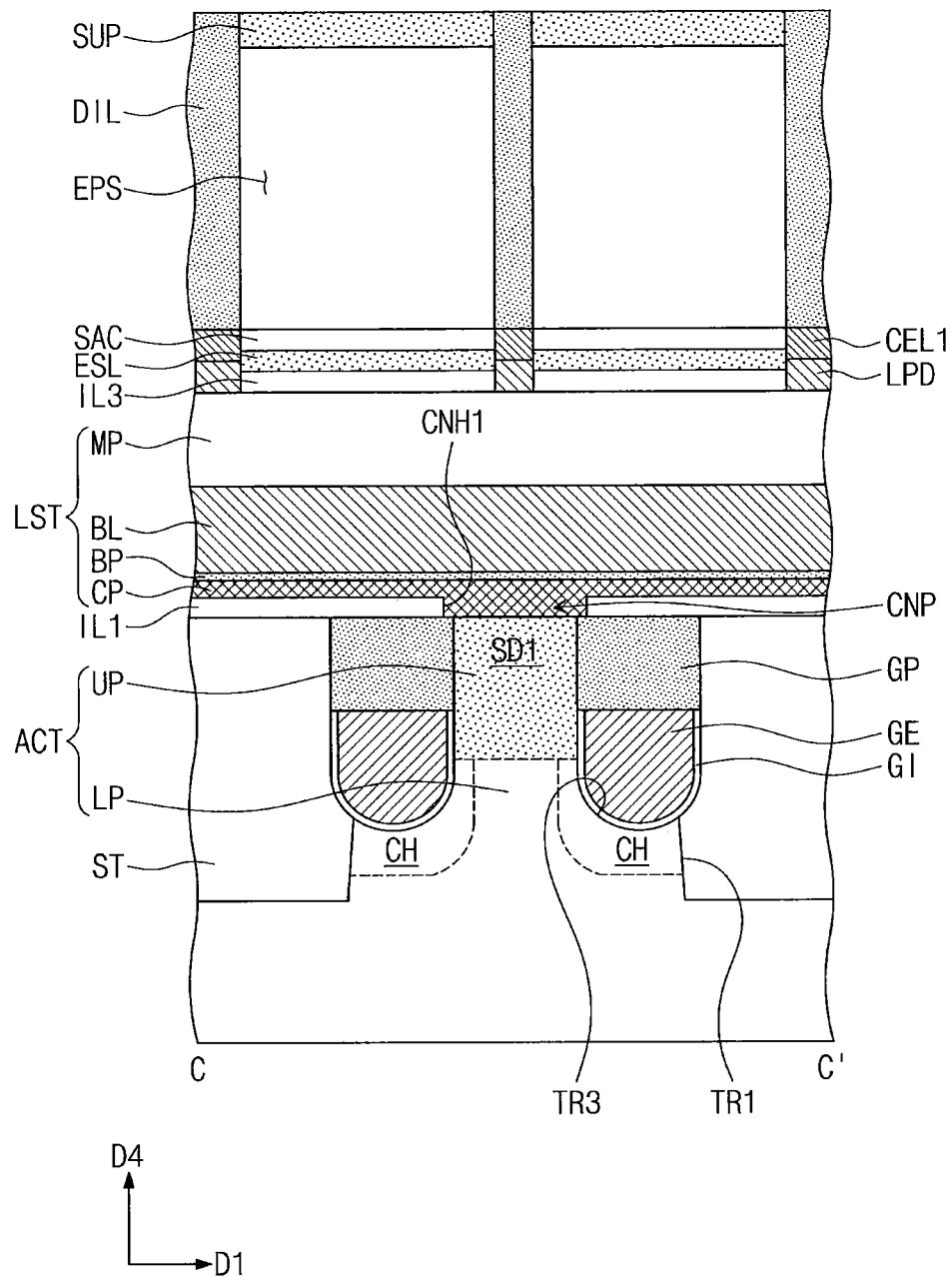
Figure 23:
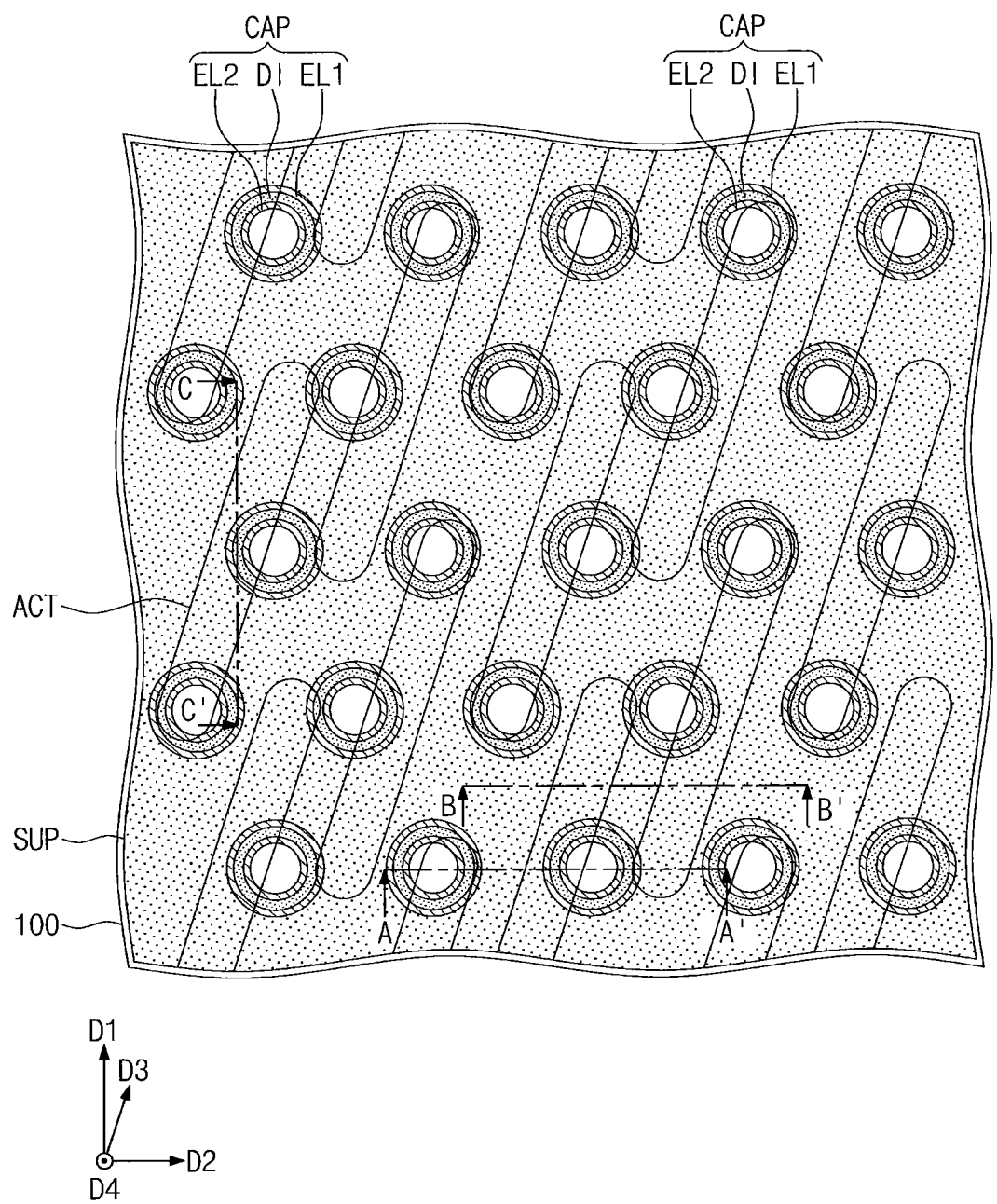
Figure 24A:
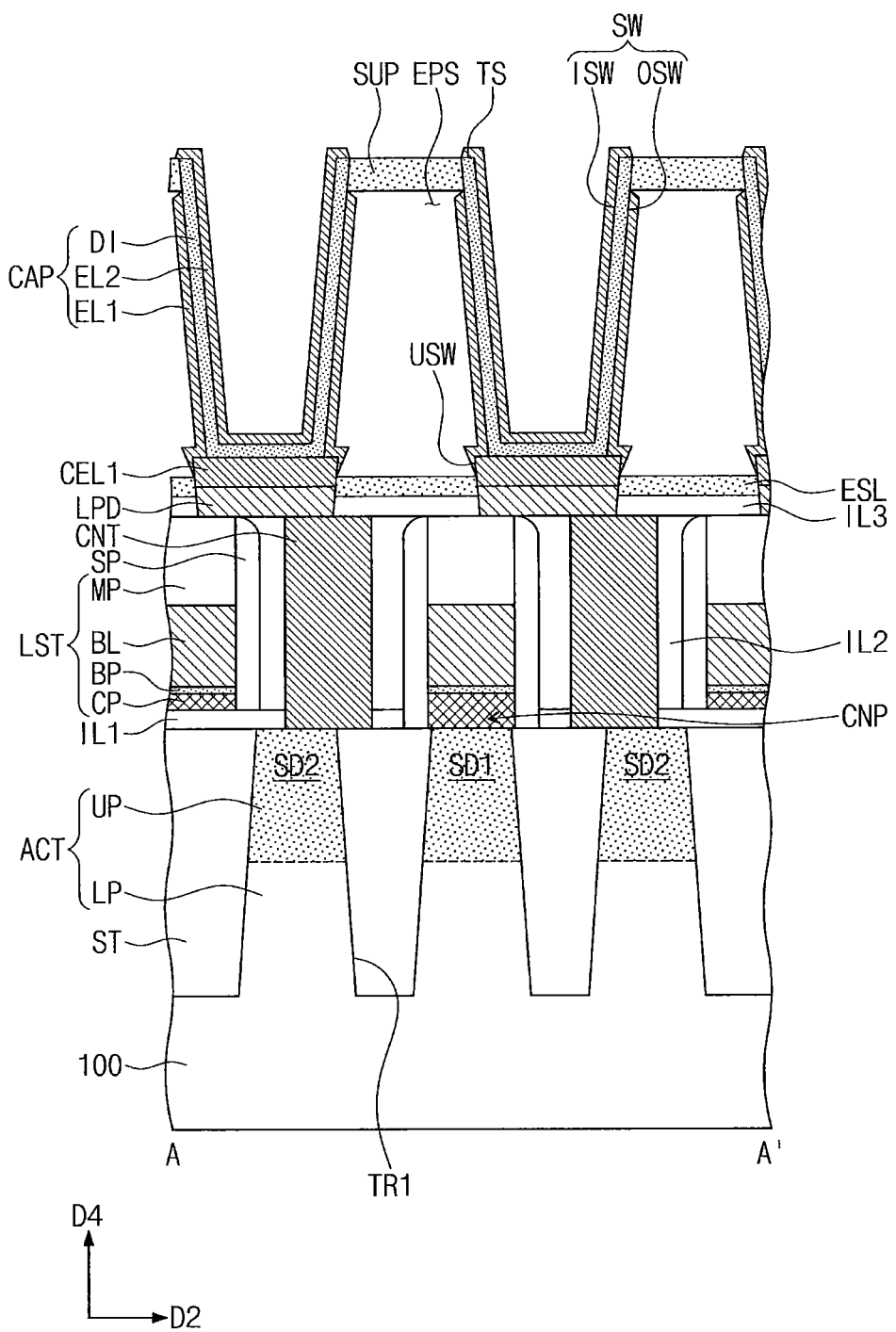
Figure 24B:
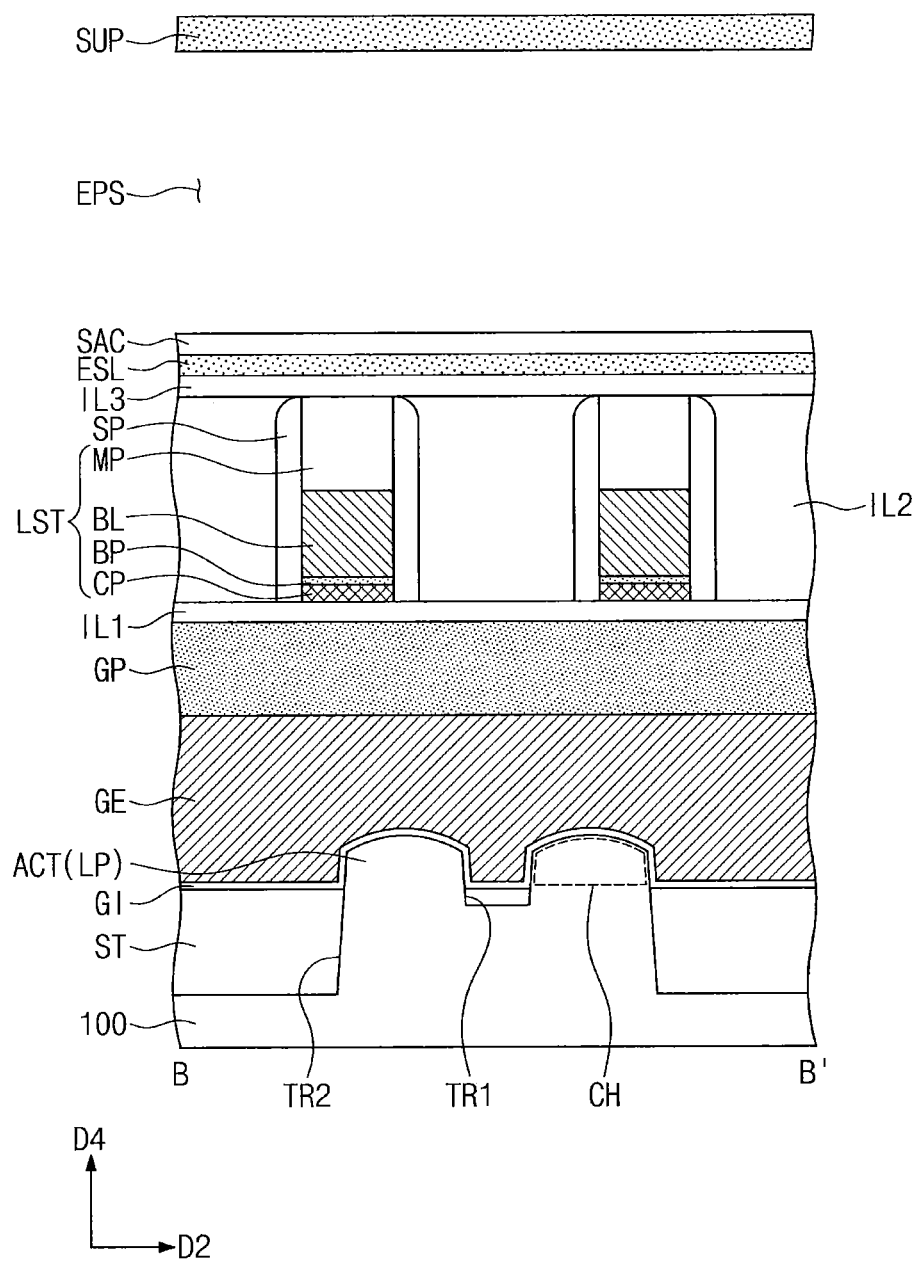
Figure 24C:
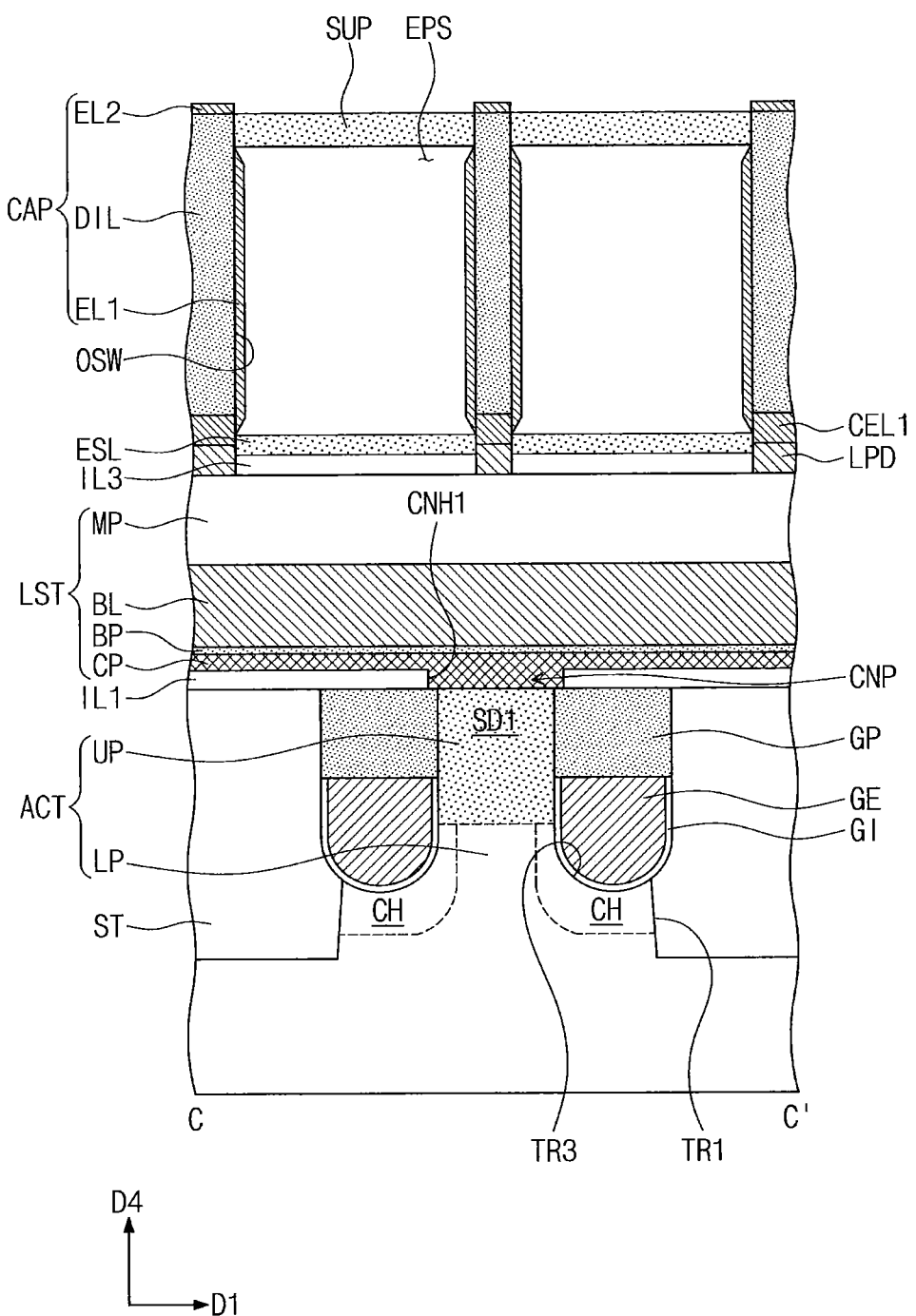

The third interlayer insulating layer IL3, the etch stop layer ESL, and the sacrificial layer SAC may be patterned (e.g., etched) to form pad holes LPH. Each of the pad holes LPH may partially expose a top surface of the contact CNT. The pad hole LPH may be offset from a corresponding contact CNT. In some embodiments, a center of the pad hole LPH in the second direction D2 may be offset from a center of the corresponding contact CNT in the second direction D2, as illustrated in FIG. 16A.

Referring to FIGS. 17 and 18A to 18C, a landing pad LPD may be formed to fill a corresponding one of the pad holes LPH, and a first connection electrode CEL1 may be formed on the landing pad LPD. The formation of the landing pad LPD may include forming a first metal layer to fill the pad holes LPH and recessing the first metal layer. The formation of the first connection electrode CEL1 may include forming on the landing pads LPD a second metal layer to fill the pad holes LPH and performing a planarization process on the second metal layer until a top surface of the sacrificial layer SAC is exposed. For example, the first metal layer may include metal, and the second metal layer may include metal or conductive metal nitride.

A mold layer MOL and a support layer SUP may be formed and sequentially stacked on the sacrificial layer SAC. For example, the mold layer MOL may include a polysilicon layer, and the support layer SUP may include a silicon nitride layer.

Referring to FIGS. 19 and 20A to 20C, the support layer SUP and the mold layer MOL may be patterned (e.g., etched) to form capacitor holes CAH. The capacitor holes CAH may expose top surfaces of the first connection electrodes CEL1, respectively. For example, the capacitor holes CAH may vertically overlap corresponding first connection electrodes CEL1.

A dielectric layer DIL may be conformally formed to partially fill the capacitor holes CAH. The dielectric layer DIL may cover an inner sidewall of the capacitor hole CAH and the top surface of the first connection electrode CEL1. The dielectric layer DIL may include a high-k dielectric material.

Referring to FIGS. 21 and 22A to 22C, a planarization process may be performed on the dielectric layer DIL until a top surface of the support layer SUP is exposed, and thus the dielectric layer DIL may be formed into a plurality of dielectric patterns DI. The dielectric patterns DI may be provided in corresponding capacitor holes CAH. Each of the dielectric patterns DI may have a cylindrical shape whose top is opened.

The mold layer MOL may be selectively removed to form an empty space EPS. The mold layer MOL may be selectively removed by an etching process using an etch recipe that selectively etches the mold layer MOL but does not etch the dielectric patterns DI, the support layer SUP, and the sacrificial layer SUP. For example, the removal of the mold layer SAC may use a wet and/or dry cleaning process.

Referring to FIGS. 23 and 24A to 24C, a selective removal may be performed on the sacrificial layer SAC exposed to the empty space EPS. The sacrificial layer SAC may be selectively removed by an etching process using an etch recipe that selectively etches the sacrificial layer SAC but does not etch the dielectric patterns DI, the support layer SUP, and the etch stop layer ESL. For example, the removal of the sacrificial layer SAC may use a chemical oxide removal (COR) mechanism of dry cleaning. Because the sacrificial layer SAC is removed, the empty space EPS may expose an upper sidewall USW (e.g., an upper portion of the sidewall) and a portion of the top surface of the first connection electrode CEL1.

First and second electrodes EL1 and EL2 may be selectively formed on the dielectric pattern DI and the first connection electrode CEL1. The first electrode EL1 may be selectively formed on the first connection electrode CEL1 and an outer sidewall OSW of the dielectric pattern DI. The second electrode EL2 may be selectively formed on an inner sidewall ISW and a top surface TS of the dielectric pattern DI. Neither the first electrode EL1 nor the second electrode EL2 may be formed on the support layer SUP and the etch stop layer ESL.

The formation of the first and second electrodes EL1 and EL2 may include forming a third metal layer using a deposition process in which a deposition material is selectively deposited on a metallic material (e.g., the first connection electrode CEL1) and a high-k dielectric material (e.g., the dielectric pattern DI). The third metal layer may include, for example, metal or conductive metal nitride.

In some embodiments, a self-assembled layer may be selectively formed on a silicon nitride layer (e.g., the support layer SUP and the etch stop layer ESL). For example, a monolayer including alkylsiloxane may be selectively formed a surface of the silicon nitride layer. A relatively long incubation time may be required to deposit the third metal layer on the silicon nitride layer on which the self-assembled layer is formed. The incubation time of the silicon nitride layer, on which the self-assembled layer is formed, may be used to selectively form the third metal layer on the first connection electrode CEL1 and the dielectric pattern DI.

In some embodiments, an etching process may be performed after the deposition process is carried out. A deposition rate of a metal precursor may depend on a kind of underlying layer. The third metal layer may be formed thicker on the first connection electrode CEL1 and the dielectric pattern DI, and formed thinner on the support layer SUP and the etch stop layer ESL. After that, a dry etching process may be performed until the third metal layer is completely removed from the support layer SUP and the etch stop layer ESL. In this case, the third metal layer may remain on the first connection electrode CEL1 and the dielectric pattern DI, and thus may constitute the first and second electrodes EU and EL2. To form the third metal layer thicker, a cycle including the deposition process and the etching process may be repeatedly performed.

For example, when a ruthenium precursor is used for the deposition process, ruthenium may be deposited relatively thick on the first connection electrode CEL1 and the dielectric pattern DI. For example, when a titanium precursor (e.g., TiCl$_4$) is used for the deposition process, titanium or titanium nitride may be deposited relatively thick on the first connection electrode CEL1 and the dielectric pattern DI.

Referring back to FIGS. 1 and 2A to 2C, a second connection electrode CEL2 may be formed on the second electrode EL2. The second connection electrode CEL2 may be formed by a deposition process, such as physical vapor deposition (PVD), whose step coverage may be poor. The second connection electrode CEL2 may include, for example, one or more of a doped semiconductor material, a metallic material, and a metal-semiconductor compound. During the deposition process, a residue pattern RP may be formed on a top surface of a lower segment of the second electrode EL2. In some embodiments, the second connection electrode CEL2 and the residue pattern RP may include the same material.

Although not shown, a plurality of connection line layers may be formed on the second connection electrode CEL2. A contact plug may be formed to electrically connect the second connection electrode CEL2 to a wiring line in the connection line layer.

Figure 25:
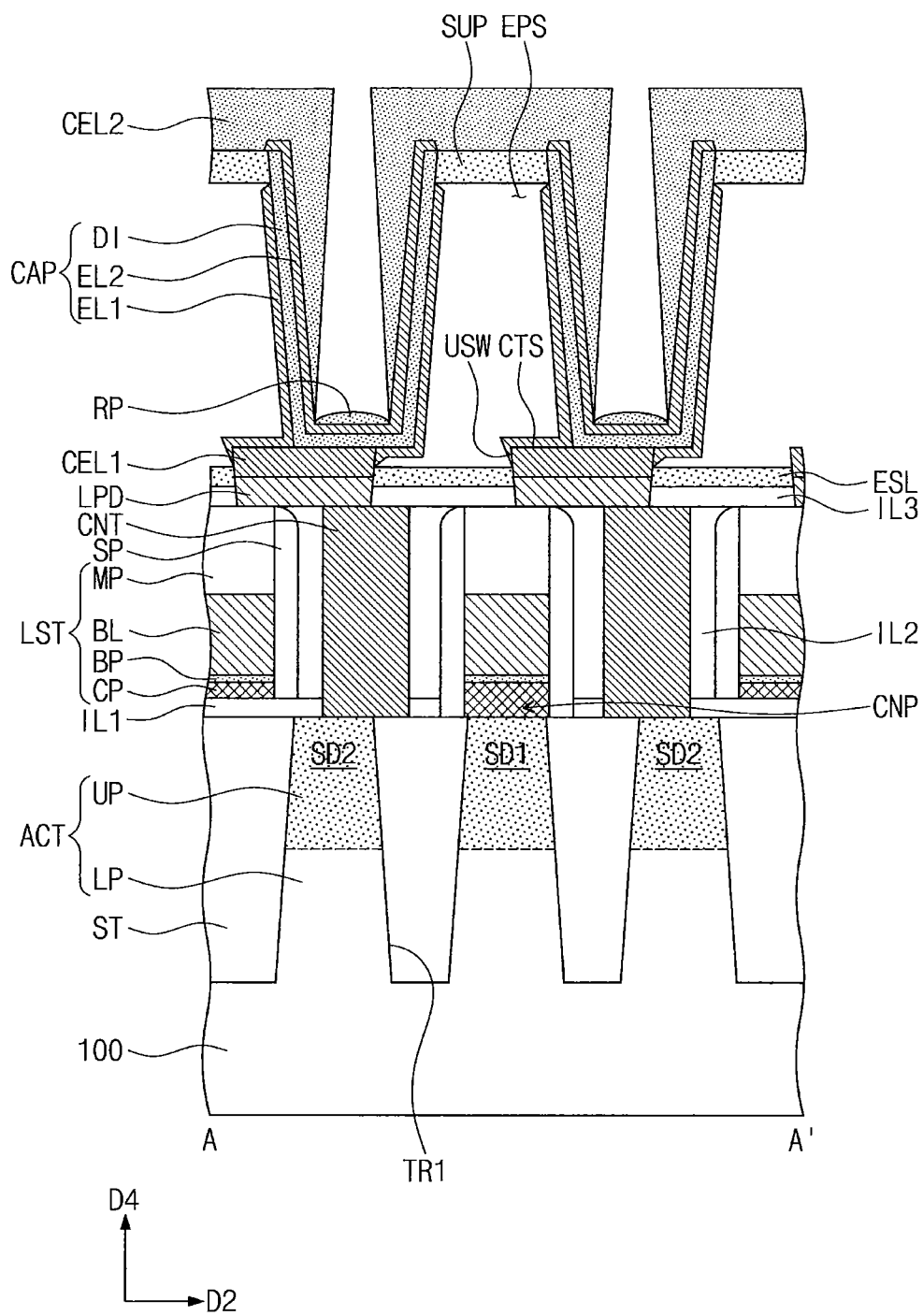
FIGS. 25 and 26 illustrate cross-sectional views taken along line A-A' of FIG. 1, showing a semiconductor device according to some example embodiments of the present inventive concepts.
Figure 26:
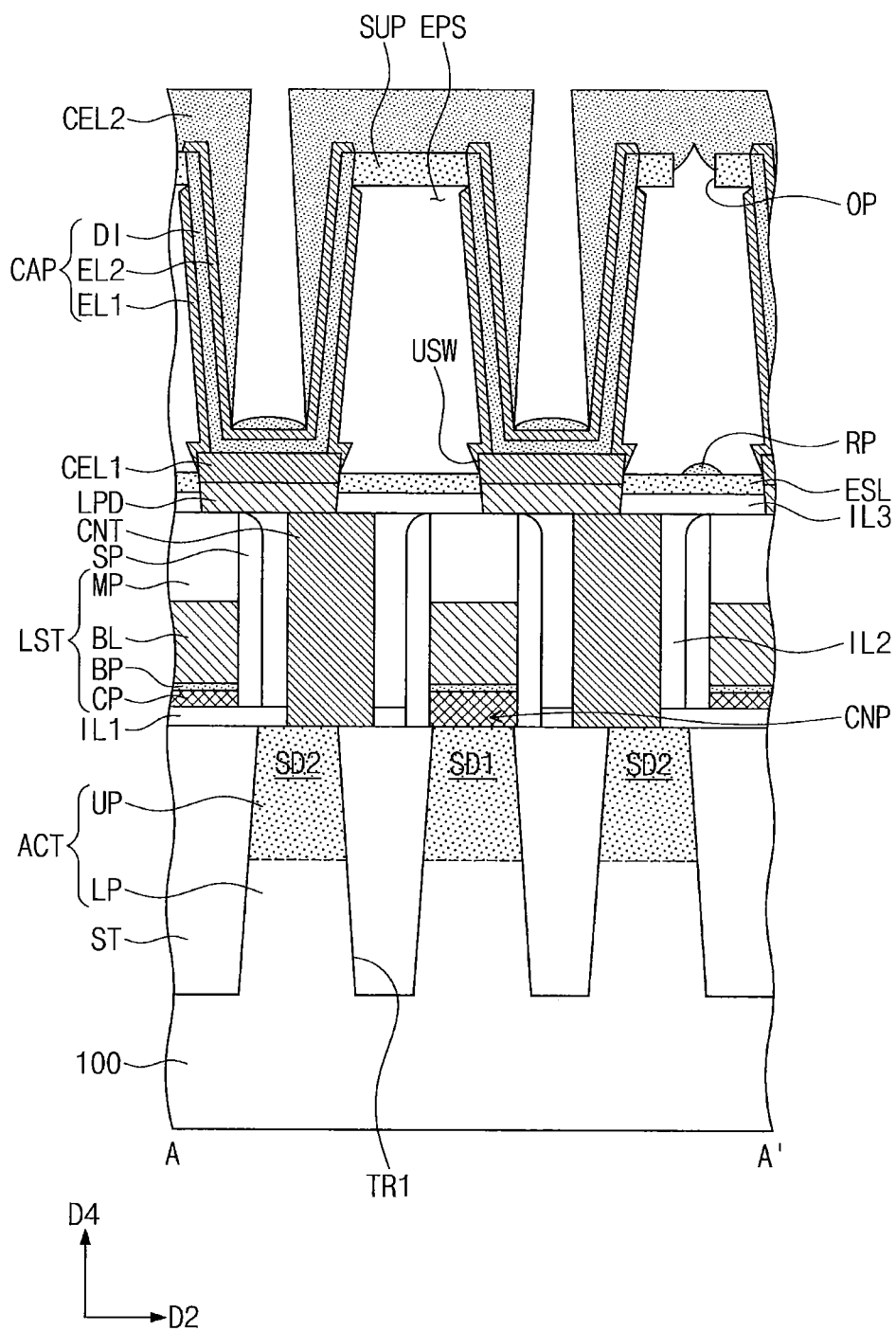

FIGS. 25 and 26 illustrate cross-sectional views taken along line A-A' of FIG. 1, showing a semiconductor device according to some example embodiments of the present inventive concepts. Detailed descriptions of technical features discussed above with reference to FIGS. 1 and 2A to 2C may be omitted, and differences from the technical features of the semiconductor device discussed above with reference to FIGS. 1 and 2A to 2C will be discussed in detail.

Referring to FIG. 25, the capacitor CAP may be misaligned with the first connection electrode CEL1. The capacitor CAP may be horizontally offset from a center of the first connection electrode CEL1. The dielectric pattern DI may partially cover the top surface of the first connection electrode CEL1. The first connection electrode CEL1 may have a top surface CTS exposed by the dielectric pattern DI. The first electrode EL1 may cover not only the upper sidewall USW of the first connection electrode EL1, but the exposed top surface CTS of the first connection electrode CEL1. The first electrode EL1 may partially cover a bottom surface of the dielectric pattern DI.

Referring to FIG. 26, the support layer SUP may have at least one opening OP. When viewed in plan, the opening OP may be formed between neighboring dielectric patterns DI.

The opening OP may be sealed with the second connection electrode CEL2 on the support layer SUP. Because the second connection electrode CEL2 is formed by a deposition process whose step coverage is poor, the opening OP may allow a conductive material to deposit on the etch stop layer ESL while the second connection electrode CEL2 is formed. Therefore, the residue pattern RP may be provided on the etch stop layer ESL. The residue pattern RP on the etch stop layer ESL may be vertically overlapped by the opening OP.

According to the present inventive concepts, a capacitor may be formed to have a relatively small diameter. The small diameter of the capacitor may increase an integration density of a semiconductor device.

Although the present inventive concepts has been described in connection with some example embodiments illustrated in the accompanying drawings, it will be understood to those skilled in the art that various changes and modifications may be made without departing from the technical spirit and essential feature of the present inventive concepts. Accordingly, the foregoing detailed description is to be considered illustrative, and not restrictive, and thus to the maximum extent allowed by law, the scope of the present inventive concepts is to be determined by the broadest permissible interpretation of the following claims and their equivalents, and shall not be restricted or limited by the foregoing detailed description.

What is claimed is:

1. A semiconductor device comprising:
   an active pattern on a substrate, the active pattern including a first source/drain region and a second source/drain region;
   a bit line electrically connected to the first source/drain region;
   a first connection electrode electrically connected to the second source/drain region; and
   a capacitor on the first connection electrode, the capacitor including a first electrode, a second electrode, and a dielectric pattern between the first and second electrodes,
   wherein the dielectric pattern comprises first and second inner sidewalls facing each other and a lower portion connecting the first inner sidewall to the second inner sidewall, and the lower portion of the dielectric pattern contacts a top surface of the first connection electrode, and
   wherein the first electrode extends on an upper portion of a sidewall of the first connection electrode.

2. The semiconductor device of claim 1, wherein the dielectric pattern has a cylindrical shape whose top is opened.

3. The semiconductor device of claim 1, wherein
   the first electrode extends on an outer sidewall of the dielectric pattern, and
   the second electrode extends on the first inner sidewall of the dielectric pattern.

4. The semiconductor device of claim 1, further comprising an insulating layer between the first connection electrode and the bit line,
   wherein the top surface of the first connection electrode is higher than a top surface of the insulating layer, and
   wherein the upper portion of the sidewall of the first connection electrode protrudes beyond the top surface of the insulating layer.

5. The semiconductor device of claim 1, further comprising a support layer that supports the capacitor,
   wherein the support layer contacts an upper portion of an outer sidewall of the dielectric pattern.

6. The semiconductor device of claim 5, wherein a top surface of the support layer is coplanar with a top surface of the dielectric pattern.

7. The semiconductor device of claim 5, further comprising:
   a second connection electrode on the second electrode and the support layer; and
   a residue pattern that comprises a material that is the same as a material of the second connection electrode and is spaced apart from the support layer in a vertical direction,
   wherein the support layer comprises an opening, and
   wherein the residue pattern is overlapped by the opening.

8. The semiconductor device of claim 1, wherein a center of the dielectric pattern is offset from a center of the first connection electrode,
   wherein the top surface of the first connection electrode comprises an exposed portion that is not contacted by the dielectric pattern, and
   wherein the first electrode extends on the exposed portion of the top surface of the first connection electrode.

9. The semiconductor device of claim 1, further comprising a support layer contacting an outer sidewall of the dielectric pattern, wherein the support layer comprises a lower surface facing the substrate and an upper surface opposite the lower surface, and
   wherein the second electrode does not extend on the upper surface of the support layer.

10. A semiconductor device comprising:
    an active pattern on a substrate, the active pattern including a first source/drain region and a second source/drain region;
    a bit line electrically connected to the first source/drain region;
    a connection electrode electrically connected to the second source/drain region; and
    a capacitor on the connection electrode, the capacitor including a first electrode, a second electrode, and a dielectric pattern between the first and second electrodes,
    wherein the first electrode extends upwardly along an outer sidewall of the dielectric pattern from an upper portion of a sidewall of the connection electrode, and the first electrode extends on a lower portion of the outer sidewall of the dielectric pattern and does not extend on an upper portion of the outer sidewall of the dielectric pattern, and
    wherein the second electrode extends upwardly along an inner sidewall of the dielectric pattern from a lower portion of the dielectric pattern.

11. The semiconductor device of claim 10, wherein the lower portion of the dielectric pattern overlaps a top surface of the connection electrode.

12. The semiconductor device of claim 10, further comprising an insulating layer between the connection electrode and the bit line,
    wherein a top surface of the connection electrode is higher than a top surface of the insulating layer, and
    wherein the upper portion of the sidewall of the connection electrode protrudes beyond the top surface of the insulating layer.

13. The semiconductor device of claim 10, further comprising a support layer that supports the capacitor,
    wherein the support layer contacts the upper portion of the outer sidewall of the dielectric pattern.

14. The semiconductor device of claim 13, wherein a top surface of the support layer is coplanar with a top surface of the dielectric pattern.

15. The semiconductor device of claim 13, wherein the second electrode does not extend on an upper surface of the support layer.

16. A semiconductor device comprising:
    a plurality of transistors on a substrate;

a plurality of capacitors electrically connected to the plurality of transistors, respectively; and a support layer that contacts upper portions of the plurality of capacitors, wherein each of the plurality of capacitors includes a first electrode, a second electrode, and a dielectric pattern between the first and second electrodes, and the dielectric pattern comprises first and second inner sidewalls facing each other and an outer sidewall extending upwardly and being opposite the first inner sidewall, and wherein the support layer contacts an upper portion of the outer sidewall of the dielectric pattern of one of the plurality of capacitors.

17. The semiconductor device of claim 16, wherein a top surface of the support layer is coplanar with a top surface of the dielectric pattern.

18. The semiconductor device of claim 16, wherein the first electrode extends on the outer sidewall of the dielectric pattern, and the second electrode extends on the first inner sidewall of the dielectric pattern.

19. The semiconductor device of claim 18, wherein the plurality of capacitors comprises a first capacitor and a second capacitor adjacent to each other, and wherein the second electrode of the first capacitor and the second electrode of the second capacitor are spaced apart from each other.

20. The semiconductor device of claim 16, further comprising a plurality of connection electrodes between the plurality of transistors and the plurality of capacitors, wherein a lower portion of the dielectric pattern of the one of the plurality of capacitors overlaps a portion of a top surface of one of the plurality of connection electrodes, and wherein the first electrode of the one of the plurality of capacitors extends on an upper portion of a sidewall of the one of the plurality of connection electrodes.

* * * * *